(12) United States Patent
Yanamoto

(10) Patent No.: US 7,358,522 B2
(45) Date of Patent: Apr. 15, 2008

(54) SEMICONDUCTOR DEVICE

(75) Inventor: Tomoya Yanamoto, Anan (JP)

(73) Assignee: Nichia Corporation, Tokushima (JP)

( * ) Notice: Subject to any disclaimer, the term of this patent is extended or adjusted under 35 U.S.C. 154(b) by 183 days.

(21) Appl. No.: 10/250,453

(22) PCT Filed: Nov. 5, 2002

(86) PCT No.: PCT/JP01/11491

§ 371 (c)(1),
(2), (4) Date: Jul. 1, 2003

(87) PCT Pub. No.: WO03/041234

PCT Pub. Date: May 15, 2003

(65) Prior Publication Data

US 2005/0127391 A1   Jun. 16, 2005

(30) Foreign Application Priority Data

Nov. 5, 2001 (JP) .............................. 2001-340078
Jan. 9, 2002 (JP) .............................. 2002-002870

(51) Int. Cl.
*H01S 5/00* (2006.01)
(52) U.S. Cl. ............................................. 257/14
(58) Field of Classification Search .................. 257/14
See application file for complete search history.

(56) References Cited

U.S. PATENT DOCUMENTS 5,006,908 A * 4/1991 Matsuoka et al. ............ 257/76
5,578,839 A   11/1996 Nakamura et al.

(Continued)

FOREIGN PATENT DOCUMENTS

EP    0 661 782 A1   7/1995

(Continued)

OTHER PUBLICATIONS

D. P. Bour et al. (2000) "Design and Performance of Asymmetric Waveguide Nitride Laser Diodes," *IEEE Journal of Quantum Electronics* 36(2), pp. 186-191.

(Continued)

*Primary Examiner*—Thomas L. Dickey
(74) *Attorney, Agent, or Firm*—Morrison & Foerster LLP

(57) ABSTRACT

A semiconductor device comprises an active layer having a quantum well structure, the active layer including a well layer and a barrier layer and being sandwiched by a first conductivity type layer and a second conductivity type layer, wherein a first barrier layer is provided on side of the first conductivity type layer in the active layer and a second barrier layer is provided on the side of the second conductivity type layer in the active layer, at least one well layer is sandwiched thereby, and the second barrier layer has a band gap energy lower than that of the first barrier layer in the form of asymmetric barrier layer structure, where the second conductivity type layer preferably includes a carrier confinement layer having a band gap energy higher than that of the first barrier layer, resulting in a reverse structure in each of conductivity type layer in respect to the asymmetric structure of the active layer to provide a waveguide structure having excellent crystallinity and device characteristics in the nitride semiconductor light emitting device operating at a wavelength of 380 nm or shorter.

3 Claims, 10 Drawing Sheets

U.S. PATENT DOCUMENTS

| | | |
|---|---|---|
| 5,684,309 A | 11/1997 | McIntosh et al. |
| 5,777,350 A | 7/1998 | Nakamura et al. |
| 5,780,876 A | 7/1998 | Hata |
| 5,786,603 A | 7/1998 | Rennie et al. |
| 5,786,606 A | 7/1998 | Nishio et al. |
| 5,793,061 A | 8/1998 | Ohuchi et al. |
| 5,841,802 A | 11/1998 | Whiteley et al. |
| 5,866,440 A | 2/1999 | Hata |
| 5,903,017 A | 5/1999 | Itaya et al. |
| 5,945,689 A | 8/1999 | Koike et al. |
| 5,959,307 A * | 9/1999 | Nakamura et al. ............ 257/14 |
| 5,990,496 A | 11/1999 | Kunisato et al. |
| 6,040,588 A | 3/2000 | Koide et al. |
| 6,147,364 A | 11/2000 | Itaya et al. |
| 6,153,894 A | 11/2000 | Udagawa |
| 6,162,656 A | 12/2000 | Kunisato et al. |
| 6,172,382 B1 | 1/2001 | Nagahama et al. |
| 6,242,761 B1 | 6/2001 | Fujimoto et al. |
| 6,252,894 B1 | 6/2001 | Sasanuma et al. |
| 6,288,416 B1 | 9/2001 | Koike et al. |
| 6,320,893 B1 | 11/2001 | Ueki |
| 6,326,236 B1 | 12/2001 | Koide et al. |
| 6,420,733 B2 | 7/2002 | Koide et al. |
| 6,423,984 B1 | 7/2002 | Kato et al. |
| 6,441,393 B2 | 8/2002 | Goetz et al. |
| 6,452,214 B2 | 9/2002 | Kaneyama et al. |
| 6,456,640 B1 | 9/2002 | Okumura |
| 6,518,082 B1 | 2/2003 | Kidoguchi et al. |
| 6,541,293 B2 | 4/2003 | Koide et al. |
| 6,555,403 B1 | 4/2003 | Domen et al. |
| 6,563,850 B1 | 5/2003 | Matsumoto et al. |
| 6,586,762 B2 | 7/2003 | Kozaki |
| 6,645,785 B2 | 11/2003 | Koike et al. |
| 6,657,234 B1 | 12/2003 | Tanizawa |
| 6,711,191 B1 | 3/2004 | Kozaki et al. |
| 6,762,070 B2 | 7/2004 | Kaneyama et al. |
| 6,764,870 B2 | 7/2004 | Okumura |
| 6,821,800 B2 | 11/2004 | Koide et al. |
| 6,853,009 B2 | 2/2005 | Kato et al. |
| 6,940,100 B2 | 9/2005 | Tsujimura et al. |
| 7,015,053 B2 | 3/2006 | Kozaki et al. |
| 7,045,809 B2 | 5/2006 | Kato et al. |
| 2002/0053676 A1* | 5/2002 | Kozaki ........................ 257/88 |
| 2004/0018657 A1 | 1/2004 | Koike et al. |
| 2004/0026705 A1 | 2/2004 | Kato et al. |

FOREIGN PATENT DOCUMENTS

| | | |
|---|---|---|
| EP | 0762516 A1 | 3/1997 |
| EP | 0772249 A2 | 5/1997 |
| EP | 0803916 A2 | 10/1997 |
| EP | 0908988 A2 | 4/1999 |
| EP | 1041650 A2 | 10/2000 |
| EP | 1122841 A1 | 8/2001 |
| EP | 1168539 A1 | 1/2002 |
| EP | 1385241 A | 1/2004 |
| GB | 2323210 A | 9/1998 |
| JP | 63-152194 A | 6/1988 |
| JP | 63-211784 A | 9/1988 |
| JP | 02-228087 A | 7/1991 |
| JP | 05-110185 | 4/1993 |
| JP | 03-166785 A | 8/1993 |
| JP | 05-206513 A | 8/1993 |
| JP | 06-021511 A | 1/1994 |
| JP | 06-164055 A | 6/1994 |
| JP | 06-268257 A | 9/1994 |
| JP | 06-268332 A | 9/1994 |
| JP | 07-147454 A | 6/1995 |
| JP | 7-235732 | 9/1995 |
| JP | 08-111558 A | 5/1996 |
| JP | 08-125281 A | 5/1996 |
| JP | 08-181386 A | 7/1996 |
| JP | 08-250807 A | 9/1996 |
| JP | 08-293623 A | 11/1996 |
| JP | 08-293643 A | 11/1996 |
| JP | 08-316528 A | 1/1997 |
| JP | 09-008412 A | 1/1997 |
| JP | 09-036423 A | 2/1997 |
| JP | 09-036430 A | 2/1997 |
| JP | 09-129926 A | 5/1997 |
| JP | 09-266326 A | 10/1997 |
| JP | 09-293935 A | 11/1997 |
| JP | 10-004210 A | 1/1998 |
| JP | 10-012922 A | 1/1998 |
| JP | 10-012923 A | 1/1998 |
| JP | 10-012969 A | 1/1998 |
| JP | 10-126006 | 5/1998 |
| JP | 10-135514 A | 5/1998 |
| JP | 10-163523 A | 6/1998 |
| JP | 10-163561 | 6/1998 |
| JP | 10-242512 | 9/1998 |
| JP | 10-242565 A | 9/1998 |
| JP | 10-256601 A | 9/1998 |
| JP | 11-054847 A | 2/1999 |
| JP | 11-074607 | 3/1999 |
| JP | 11-112087 | 4/1999 |
| JP | 11-214788 | 8/1999 |
| JP | 11-274644 A | 10/1999 |
| JP | 11-298090 A | 10/1999 |
| JP | 11-340559 A | 12/1999 |
| JP | 11-340580 | 12/1999 |
| JP | 2000-091629 A | 3/2000 |
| JP | 2000-091630 A | 3/2000 |
| JP | 2000-091631 A | 3/2000 |
| JP | 2000-091705 A | 3/2000 |
| JP | 2000-091708 | 3/2000 |
| JP | 2000-156544 A | 6/2000 |
| JP | 2000-196194 | 7/2000 |
| JP | 2000-208875 A | 7/2000 |
| JP | 2000-232259 | 8/2000 |
| JP | 2000-261106 | 9/2000 |
| JP | 2000-286447 A | 10/2000 |
| JP | 2000-349377 A | 12/2000 |
| JP | 2000-349398 A | 2/2001 |
| JP | 2001-044570 A | 2/2001 |
| JP | 2001-077413 A | 3/2001 |
| JP | 2001-168471 | 6/2001 |
| JP | 2001-203385 | 7/2001 |
| WO | 99/16156 A1 | 4/1999 |
| WO | WO-00/17972 A1 | 3/2000 |
| WO | WO-00/52796 A1 | 9/2000 |
| WO | WO-00/76004 A1 | 12/2000 |
| WO | WO-02/080320 A1 | 10/2002 |

OTHER PUBLICATIONS

Kay Domen et al. (1998) "Electron Overflow to the AlGaN p-Cladding Layer in InGaN/AlGaN MQW Laser Diodes," *MRS Internet J. Nitride Semiconduc. Res.* 3(2), 5 pages.

European Search Report dated Jun. 8, 2005.

Goto, S. et al. (2001). "Improvement of Quantum Efficiency by InGaN Interlayer for Blue-violet Laser Diodes," *Extended Abstracts of the 48th Spring Meeting of The Japan Society of Applied Physics and Related Societies* 1(28p-E-12):369; and English Abstract.

Salvador, A. et al. (1995). "Properties of Si Doped GaN/AlGaN Single Quantum Well." *Applied Physics Letters* 67(22):3322-3324.

Koide et al. (1986). "Energy Band-Gap Bowling Parameter in an $Al_x Ga_{1-x} N$ Alloy," *J. Appl. Phys.* 61(9):4540-4543.

Korean Opposition Notice mailed on Nov. 27, 2006. 37 pages.

Japanese Office Action mailed Mar. 13, 2007, directed at counterpart JP application No. 2002-320916.

* cited by examiner

Direction of crystal growth

SEMICONDUCTOR DEVICE

TECHNICAL FIELD

The present invention relates to a semiconductor light emitting device, in particular to a light emitting device that has quantum well layer made of nitride semiconductor as an active layer.

BACKGROUND ART

Light emitting devices, such as LED and LD, that emit light of shorter wavelengths, e.g. about 375 nm or less, are required to provide a white LED as a substitute for the mercury lamp or to meet the requirement to improve the precision of photolithography process.

As a GaN-based light emitting device, on the other hand, many light emitting devices that include the active layer of InGaN are widely demanded for the reason of high light emitting efficiency. In order to have the light emitting devices that use InGaN as the active layer emit light of such short wavelengths as described above, it is necessary to decrease the concentration of In therein. However, as the concentration of In becomes lower, light emission efficiency of InGaN becomes lower with the threshold current increasing, thus resulting in such a problem as the threshold becomes especially high at wavelengths of laser oscillation not longer than 380 nm.

DISCLOSURE OF INVENTION

The present invention aims at finding out the cause of the problem that the threshold becomes especially high at wavelengths of laser oscillation not longer than 380 nm, and provide means for solving the problem.

Also when a nitride semiconductor including Al such as AlGaN is used in the device, differences in the thermal expansion coefficient and in the elasticity become greater than those in the case of a nitride semiconductor that does not include Al. Thus use of a nitride semiconductor including Al makes cracks easier to occur and, as the occurrence of cracks leads to the destruction of device unlike other crystallinity. Therefore, the device cannot operate as a nitride semiconductor device unless cracks are prevented from occurring. In the light emitting device and the laser device that use the active layer that emits light of wavelength not longer than 380 nm, since the band gap energy can be increased in the nitride semiconductor including Al, it can be used in a carrier confinement layer, an optical guide layer, a light confinement layer, etc. that have a higher band gap energy than the active layer. That is, in the light emitting device that emits light of such short wavelengths as described above, the nitride semiconductor including Al has such a structure as each layer has a multiple-layer construction, while the occurrence of cracks described above becomes severe so that light emission with shorter wavelengths and crack prevention are contradictory, thus imposing a serious impediment on the attempts to achieve light emitting with shorter wavelengths in a light emitting device made of a nitride semiconductor. Moreover, in an attempt to achieve light emission with shorter wavelengths, since GaN has light absorption end at 365 nm and has a high absorption coefficient in a region of wavelengths about 10 nm longer, it becomes difficult to use in a light emission device, laser device operating at wavelengths of 380 nm or less.

In addition, since the light emission efficiency and internal quantum efficiency of the active layer of the light emitting device and the laser device have heavy dependency on the crystallinity thereof, crystallinity of conductivity type layers located below the active layer is an extremely important factor in improving the device characteristics. In case a nitride semiconductor light emitting device typically has such a structure as an n-type layer, an active layer and a p-type layer are stacked in this order, crystallinity of the n-type layer must be satisfactory. On the other hand, the nitride semiconductor including Al has a higher tendency of crystallinity to deteriorate than a nitride semiconductor that does not include Al. To circumvent this problem in the prior art, such techniques have been employed as a nitride semiconductor including In is used as the under layer for the nitride semiconductor including Al thereby to mitigate the occurrence of internal stress due to the difference in thermal expansion coefficient, or a nitride semiconductor not including Al such as GaN is formed adjacent to the nitride semiconductor including Al so as to restore the crystallinity and mitigate the internal stress, thereby making a structure of laser device or the like having the nitride semiconductor including Al to operate satisfactorily in practice. However, in the light emitting device and the laser device operating at short wavelengths described above, the nitride semiconductor including Al acts as a light absorbing layer that is not desirable for the device. Therefore, most devices employ the nitride semiconductor including Al that makes it impossible to achieve the light emitting device and the laser device having practical levels of threshold, Vf(forward voltage) value and light emission efficiency due to the crystallinity and the occurrence of cracks described above. In a laser device that makes much use of the nitride semiconductor including Al that has a high Al mixed crystal ratio in an optical guide layer, a optical confinement cladding layer or the like, in particular, it has not been possible to achieve continuous oscillation at the room temperature.

The present invention has been made in consideration of the problems described above based on finding out that the problems can be solved by a device structure that has asymmetry in the band structure and composition, wherein the problem of the crystallinity and the occurrence of cracks described above are circumvented so as to obtain a device structure that can be used in a light emitting device operating at short wavelengths and a laser device having a waveguide in a device that employs the nitride semiconductor including Al such as a semiconductor light emitting device operating at short wavelengths. Particularly in a system where carrier characteristics for hole and electron greatly differ, such as a nitride semiconductor, the device structure having asymmetry in the band structure and composition that has excellent light emission efficiency is used by achieving an excellent efficiency of carrier injection into the active layer and confining the carrier satisfactorily in the active layer, and provide a waveguide structure having excellent crystallinity and device characteristics in the nitride semiconductor light emitting device operating at short wavelengths.

The present invention relates to a semiconductor device having such a structure as an active layer of quantum well structure that has a well layer and a barrier layer is sandwiched by a first conductivity type layer and a second conductivity type layer. In an application to make a laser device or an end-face light emitting device, such a waveguide is provided as an active layer 27 is formed between a lower optical guide layer 26 and an upper optical guide layer 29 as shown in FIG. 2A. In this case, optical confinement cladding layers 25, 30 are formed at positions far from the active layer than the optical guide layer, so as to constitute such a structure as the upper optical guide layer 29 is formed between the upper cladding layer 30 and the active layer 27, and the optical guide layer is formed between the lower cladding layer 25 and the active layer 27. In case the present invention is applied to a light emitting device as shown in FIGS. 6A and 6B, on the other hand, such a constitution may be employed as a layer 202 that becomes a carrier injection and confinement layer is provided as the first conductivity type layer, while a carrier injection layer 205 and a carrier confinement layer 204 are provided as the second conductivity type layers. In above case the first conductivity type layer may be constituted of two or more different layers including the carrier injection layer and the carrier confinement layer as in the second conductivity type layer, and such a constitution may also be employed as the second conductivity type layer serves both carrier injection and carrier confinement.

It is preferable in the invention that the active layer 27 includes a first barrier layer and a second barrier layer as the barrier layer 2 so as to sandwich at least one well layer 1 as shown in FIGS. 3A, 3B, 5A and 5B, while the first barrier layer is provided on side of the first conductivity type layer and the second barrier layer is provided on the side of the second conductivity type layer, and the second barrier layer has a band gap energy lower than that of the first barrier layer. Specifically, as shown in FIGS. 3A, 3B, 5A and 5B, at least one well layer 1 is provided between the first barrier layer and the second barrier layer disposed on the first conductivity type layer and the second conductivity type layer, respectively, separated by the well layer in the active layer, with the band gap energy of the second barrier layer 2b being set lower than the band gap energy of the first barrier layer 2a (dashed line 53 in the drawing), so as to form a path 51 of the present invention that is more effective in accelerating the injection of carrier from the second conductivity type layer than the conventional carrier path 52 shown in the drawing, thereby lowering the potential barrier and increasing the efficiency of injecting the carrier into the active layer and the well layer or layers. Particularly in a nitride semiconductor of such a structure as n-type side is the first conductivity type layer and p-type side is the second conductivity type layer, gallium nitride semiconductor material where diffusion length of hole is shorter than that of electron and activation rate for p-type carrier is low is preferable since it makes it possible to inject holes into the well layer more efficiently and decrease the efficiency of light emission and threshold current density. In a light emitting device and a laser device that employs nitride semiconductor operating in short wavelength region, the second barrier layer 2b provided in the active layer as a layer having a lower Al mixed crystal ratio than the Al mixed crystal ratio (dashed line 50 in FIG. 2B) of the conventional structure that is approximately the same as the first barrier layer 2a prevents the crystallinity from deteriorating, while providing the second barrier layer having an Al mixed crystal ratio lower than that of the first barrier layer causes different stresses to be applied on the lower interface and on the upper interface in the well layer that is interposed between both barrier layers, so that piezoelectric field due to the nitride semiconductor that includes Al is decreased and band gap strain can be mitigated and the efficiency of light emission in the well layer can be improved.

Since the first conductivity type layer is n-type layer, the second conductivity type layer is p-type layer and the first conductivity type layer, the active layer and the second conductivity type layer are stacked in this order, good light emitting device can be obtained as indicated by the embodiment, while a nitride semiconductor device where the first conductivity type layer has n-type nitride semiconductor layer and the second conductivity type layer has p-type nitride semiconductor layer allows preferably injection of carrier from the second conductivity type layer that is a p-type layer into the active layer by making use of the characteristics of each carrier, as described above. In a light emission device operating at short wavelengths that makes much use of nitride semiconductor including Al, on the other hand, Al mixed crystal ratio in the second barrier layer located above the active layer can be made lower than that of the first barrier layer located below, thus achieving a better crystallinity of the p-type layer formed on the active layer.

With the arrangement of the first barrier layer and the second barrier layer in the active layer, since the first barrier layer is disposed nearest to the first conductivity type layer as a barrier layer in the active layer and the second barrier layer is the barrier layer disposed nearest to the second conductivity type layer, such a structure can be made as the efficiency of injection from the second conductivity type layer by the second barrier layer is improved and the effect of the first barrier layer to confine the carrier is improved, thus improving the functions of the first barrier layer, second barrier layer.

Also as shown in FIGS. 5A and 5B, as the second barrier layer 2b is the layer located at the most outside position in the active layer 12, this is a preferable structure since satisfactory effect of accelerating the carrier injection is achieved compared to a case where the well layer or other layer is located outside the second barrier layer 2b as shown in FIG. 4B. More preferably, providing the first barrier layer as the outermost layer in the active layer makes an active layer of quantum well structure that achieves the highest effect thereof. That is, carrier injection and confinement can be efficiently achieved in the well layer that is provided between the first barrier layer and second barrier layer which are provided respectively as the outermost layer in the active layer.

It is preferable in the invention that the first conductivity type layer has a first semiconductor layer that has a band gap energy lower than that of the first barrier layer. While it has been typically required to have a band gap energy higher than that of the well layer in layers of respective conductivity types serving as the carrier injection layers that sandwich an AlGaN active layer of a light emission device operating at short wavelengths, as shown in FIGS. 3A, 3B, 5A and 5B, since such a first semiconductor layer 26 is provided in the first conductivity type layer 11 that has a band gap energy lower than that of the first barrier layer 2a provided in the active layer 12, a novel device structure is provided where the active layer is formed with good crystallinity and the first barrier layer 2a has the function to confine the carrier from the second conductivity type layer 11 in the well layer. In this structure, what is more effective is the capability to decrease the Al mixed crystal ratio of the layers that sandwich the active layer in the light emission device operating at short wavelengths. In this case, the well layer may be made of nitride semiconductor including Al that has a band gap energy equal to or higher than that of GaN, while forming the first semiconductor layer 26 with an Al mixed crystal ratio lower than the Al mixed crystal ratio of the first barrier layer 2a as shown in FIG. 2B, specifically with the composition described above. The nitride semiconductor of the composition described above can be used also for the first barrier layer. For the first semiconductor layer, a nitride semiconductor having a band gap energy higher than that of the well layer is preferably used, so that the layer functions as a satisfactory carrier injection layer from the active layer into the well layer. Specifically, a nitride semiconductor including Al is used and preferably $Al_xGa_{1-x}N$ ($0 \leq x < 1$) is used that makes it possible to form an active layer of good crystallinity.

In addition to the constitution described above, more preferably a carrier confinement layer having a band gap energy higher than that of the first barrier layer is provided in the second conductivity type layer. That makes a device of such a structure as the carrier from the first conductivity type layer is confined preferably in the active layer. This is because, as described above, the second barrier layer $2b$ located on the side of the second conductivity type layer in the active layer has a band gap energy lower than that of the first barrier layer $2a$ and is less effective as to the barrier function to confine the carrier from the first conductivity type layer that overcome the well layer. Accordingly, in order to prevent the carrier overflow in the second barrier layer $2b$, the carrier confinement layer 29 is provided in the second conductivity type layer 13 outside of the active layer 12 as shown in FIGS. 3A, 3B, 5A and 5B, that solves the problem described above. At this time, more preferably the first conductivity type layer is n-type and the second conductivity type layer is p-type. In this constitution, since the first barrier layer functions to confine holes in the active layer in a system of different carrier characteristic such as nitride semiconductor, confinement of carrier at a position near the well layer is achieved and, in the first semiconductor layer, the carrier having long diffusion lengths from the first barrier layer can be confined between the second barrier layer and the carrier confinement layer by the second barrier layer and the carrier confinement layer located outside the active layer by having the first semiconductor layer function as electron (carrier of first conductivity type) injection of the first conductivity type layer. When the second barrier layer is used as the barrier for sufficiently confining the carrier from the first conductivity type layer, conversely, the carrier injection effect of the second barrier layer that has a low band gap energy of the present invention is lowered, resulting in lower function of the active layer in such a system as the diffusion length and carrier concentration greatly differ between hole and electron as in the nitride semiconductor. Therefore, it is preferable to provide the carrier confinement layer outside the active layer and is used in combination with an asymmetrical active layer constituted from the first barrier layer and the second barrier layer having different values of the band gap energy in the active layer, which allows the effects of the present invention described above to be achieved preferably.

When the carrier confinement layer is doped with a p-type impurity to turn into the second conductivity type layer, the carrier confinement layer is formed adjacent to the active layer as a high barrier for the carrier from the first conductivity type layer that is an n-type layer when bias voltage is applied, as shown in FIGS. 3A, 3B, 5A and 5B, thereby making a structure that prevents overflow of the carrier into the active layer. Conversely, when the carrier confinement layer doped with a p-type impurity is provided in the active layer, a p-n junction is formed in the active layer resulting in lower function of the active layer. Thus the barrier function to confine the carrier from the first conductivity type layer preferably in the active layer can be achieved to the maximum by forming a p-n junction near the carrier confinement layer adjacent to the active layer, and preferable nitride semiconductor device structure can be formed by means of an asymmetrical structure where the carrier from the second conductivity type layer is confined by the first conductivity type layer.

The carrier confinement layer is preferably provided adjacent to the active layer, which makes it possible to confine the carrier from the first conductivity type layer in proximity to the active layer, while being proximity of the first semiconductor layer to the active layer allows efficient injection of the carrier, thereby achieving preferable injection of carrier into the active layer.

It is also preferable to provide the barrier layers so that the difference in band gap energy between the first barrier layer and the second barrier layer is 0.02 eV or larger. This is because the structure has higher carrier confinement effect outside of the active layer as in the carrier confinement layer described above or a cladding layer for the carrier from the second conductivity type layer, while confinement of carrier in the well layer is achieved by the first barrier layer $2a$ for the carrier from the second conductivity type layer, thereby augmenting the asymmetry of the carrier confinement structure thereby making the effects described above better. That is, it is made possible to further improve the confinement function of the first barrier layer for the carrier from the second conductivity type layer and the effect of improving the injecting the carrier from the second conductivity type layer into the well layer beyond the smaller second barrier layer.

In addition to the constitution described above, such a constitution is employed that has a second semiconductor layer having a band gap energy lower than that of the first barrier layer and is separated from the active layer via the carrier confinement layer. The second semiconductor layer corresponds to the first semiconductor layer and, in case the first conductivity type layer is an n-type layer and the second conductivity type layer is a p-type layer, satisfactory confinement in the active layer is achieved by providing via the carrier confinement layer that confines the carrier from the first conductivity type layer, thereby achieving similar effects to those of the first semiconductor layer having a lower band gap energy, as described above.

In case the quantum well structure of the active layer is multiple quantum well structure that has a plurality of well layers, it is preferable that an internal barrier layer is provided between the first barrier layer $2a$ and the second barrier layer $2b$ via the well layer 1 as shown in FIGS. 5A and 5B, so that the internal barrier layers $2c$, $2d$ have band gap energies different from that of the second barrier layer $2b$. The internal barrier layers $2c$, $2d$ are provided between the first barrier layer $2a$ and the second barrier layer $2b$ as indicated as $2c$, $2d$ in FIGS. 5A and 5B, and the first barrier layer $2a$ and the second barrier layer $2b$ are provided via the well layers $1a$, $1b$, so as to improve the function to distribute the carrier to the well layers as indicated by the arrow in the drawing and give a function different from that of the first and second barrier layers that are provided on the outside, by setting the band gap energy of the internal barrier layers to a value different from that of the second barrier layer $2b$. This enables it also to improve the function of the first and second barrier layers as described above. In this case, it is preferable to set the band gap energy of the internal barrier layers to a value higher than that of the second barrier layer as shown in FIG. 5B, which causes the carrier from the second conductivity type layer to migrate through the internal barrier layer and the first barrier layer as it nears the first conductivity type layer so as to form stepwise increasing barriers. That is, this structure has carrier confinement effect that increases with the distance from the second conductivity type layer stepwise so that the carrier can be distributed preferably in the well layers that adjoin the barrier layers. Efficiency of injecting the carrier into the well layer near the first barrier layer can be improved, resulting in a structure where more carrier can be injected into the well layers.

Preferably the band gap energy of the first barrier layer is set lower than that of the internal barrier layer so that, as shown in FIGS. 5A and 5B, improvement of the function to inject the carrier from the second conductivity type layer into by lowering the barrier of the second barrier layer as well as improvement of injecting the carrier into the well layers by the internal barrier layer can be achieved. Also by setting the band gap energy of the internal barrier layer lower than that of the first barrier layer and setting the band gap energy of the second barrier layer lower than that of the internal barrier layer, such a structure of the barrier layers is obtained as shown in FIG. 5B as the band gap energy for the injection of carrier from the second conductivity type layer increases with the distance from the second conductivity type layer, so that the functions of the barrier layers are improved, while each performing different function in the active layer.

While thickness of the internal barrier layer may be made substantially equal to or different from that of the first barrier layer and the second barrier layer located outside of the internal barrier layer in the active layer, preferably thickness of the internal barrier layer is made thinner than at least one of the first barrier layer and the second barrier layer. This is because, it is considered, the internal barrier layer that is formed between the well layers has a function different from that of the first barrier layer and the second barrier layer that are formed outside and, when the internal barrier layer is made thicker, barrier function would be increased so as to impede uniform injection of carrier into the well layers. The efficiency of recombination throughout the active layer is considered to be improved by setting the thickness smaller than that of the barrier layer located outside so as to improve the efficiency of injecting and distributing the carrier into the well layers. When considering the stress acting between the well layer and the barrier layer, increasing thickness of the internal barrier layer disposed between the well layers causes the adverse effect of the internal stress on the well layer due to the difference in the Al mixed crystal ratio between the layers to aggravate, leading to functional deterioration of the well layer, thus resulting in the adverse effect on the well layer due to the strong piezoelectricity by the nitride semiconductor including Al. Further increasing the thickness of the internal barrier layer increases the thickness of the entire active layer, and therefore the resultant deterioration of crystallinity in the active layer that uses the nitride semiconductor including Al causes a serous influence on the deterioration of device characteristics.

In the case of a plurality of internal barrier layers, for example another barrier layer 2d is provided via an internal barrier layer 2c and the well layer 1b as shown in FIG. 5B, at least one internal barrier layer is made thinner than at least one of the first and second barrier layers located outside, and it is preferable to make all the internal barrier layers thinner than at least one of the first barrier layer and the second barrier layer, which improves the function of the internal barrier layer and reinforce the tendency of functional separation from the outside barrier layer. In an aspect of the present invention where a plurality of barrier layers of different compositions are provided between the most proximate well layers, at least one of the plurality of barrier layers is made thinner than at least one of the barrier layer located outside, preferably total thickness of the barrier layers located between the well layers, namely the distance between the most proximate well layers is made smaller than the thickness of at least one of the outside barrier layers, which enables it to improve the function of the plurality of barrier layers located between the most proximate well layers as a whole.

Similarly to the first barrier layer and the second barrier layer that are disposed outside, the internal barrier layer may be either doped with one or both of n-type and p-type impurities, or undoped so as to include substantially no dopant. Preferably, in case the first conductivity type layer is an n-type layer and the second conductivity type layer is a p-type layer, the internal barrier layer is doped with an n-type impurity similarly to the first barrier layer. This is considered to be particularly effective in a system of materials having diffusion length, carrier concentration and mobility that are different for electron and hole as in the nitride semiconductor, probably because the presence of the carrier up to near the p-type layer (the second conductivity type layer) in the active layer makes it possible to inject the carrier from the n-type layer efficiently up to near the p-type layer deep in the active layer. Also because the carrier confinement layer is formed in the vicinity of the active layer in the second conductivity type layer and a p-n junction is formed near this layer, electrons can be injected efficiently up to near the p-n junction thus resulting in improved efficiency of recombination in the active layer. At this time, in such an aspect as a plurality of well layers are provided and a plurality of internal barrier layers are provided, it is preferable that at least one of the internal barrier layers is doped with an n-type impurity, and it is more preferable that a plurality of internal barrier layers are doped with an n-type impurity successively from the internal barrier layer that is located on the n-type layer side, and it is most preferable that all the internal barrier layers are doped with an n-type impurity.

The well layer is preferably doped with an n-type impurity in a low concentration and, in case the first conductivity type layer is an n-type layer in particular, concentration of the n-type impurity is set lower than in the first barrier layer, as described later. In case the first conductivity type layer is an n-type layer in particular, concentration of the n-type impurity in the second barrier layer is set lower than in the first barrier layer which enables it to efficiently inject the carrier into the n-type layer (the first conductivity type layer) and enables efficient injection of the carrier because carrier injection from the p-type layer (the second conductivity type layer) is not impeded in the second barrier layer, as will be described later.

Also in case each conductivity type layer has an optical guide layer, and the concentrations of the impurities that make dopants of different conductivity types differ in the layer while the first conductivity type layer is an n-type layer as shown in FIGS. 8B to 8D, it is preferable to be doped with the n-type impurity in a higher concentration than the low impurity concentration region in the optical guide layer provided in the first conductivity type layer, since it improves the effect of carrier injection into the active layer by the first barrier layer and the effect of mitigating the optical loss due to the low impurity concentration region. In the p-type layer, namely the second conductivity type layer, in case the second barrier layer is doped with a p-type impurity, the concentration tends to become higher than in the low impurity concentration region of the optical guide layer, due to the diffusion from the carrier confinement layer that is doped with the p-type impurity more heavily than the optical guide layer. This is preferable because the carrier confinement layer becomes smaller than the thickness of the low impurity concentration region thus making the concentration in the second barrier layer higher compared to the mean impurity concentration, and in the second barrier layer that is located in the active layer and has small thickness, the influence of optical loss is less significant, thereby achieving the effect of contributing to the carrier injection from the p-type layer.

In the device structure that uses nitride semiconductor described above where the active layer has the well layers and the barrier layers that are made of nitride semiconductor, the first conductivity type layer has nitride semiconductor and the second conductivity type layer has nitride semiconductor, the device structure is very useful for a light emission device operating at short wavelengths wherein the well layer is formed of nitride semiconductor including Al that has a band gap energy higher than GaN, as described previously. That is, since the first semiconductor layer in the first conductivity type layer and the second semiconductor layer in the second conductivity type layer to interpose on the outside of the active layer are formed to have a band gap energy lower than in the conventional structure, Al mixed crystal ratio in each layer can be kept lower so as to achieve a device structure that restricts the deterioration of crystallinity and the internal stress. Specific composition of the well layer made of nitride semiconductor is preferably GaN, $Al_xGa_{1-x}N$ ($0<x\leq1$), or $Al_xIn_yGa_{1-x-y}N$ ($0<x\leq1$, $0<y\leq1$, $x+y<1$). In the case of GaN that is a binary compound semiconductor, the crystal can grow without interaction between the elements so as to obtain good crystallinity due to the small number of the constituent elements. In the case of tertiary compound semiconductor $Al_xGa_{1-x}N$ ($0<x\leq1$), light of shorter wavelength can be emitted than GaN does, while the crystal can grow with less interaction between the elements so as to obtain good crystallinity due to the small number of the constituent elements. In the case of quaternary compound semiconductor $Al_xIn_yGa_{1-x-y}N$ ($0<x\leq1$, $0<y\leq1$, $x+y<1$), presence of In improve the light emission efficiency of the well layer. At this time, a nitride semiconductor having composition of $Al_uIn_vGa_{1-u-v}N$ ($0<u\leq1$, $0\leq v\leq1$, $u+v<1$) maybe used for the barrier layer. Since the barrier layer has a band gap energy higher than the well layer, the nitride semiconductor is used in the well layer of the composition described above such that the Al mixed crystal ratio u in the barrier layer is higher than the Al mixed crystal ratio x in the well layer (x<u). At this time, it is preferable to make the difference between the Al mixed crystal ratio u in the barrier layer and the Al mixed crystal ratio x in the well layer not less than 0.1, namely $u-x\geq0.1$. This is because satisfactory barrier layer can be formed by using nitride semiconductor including Al with 0.1 or larger difference in the Al mixed crystal ratio in order to achieve satisfactory carrier confinement function by the first barrier layer in the nitride semiconductor device operating at short wavelengths. Upper limit of the difference in the Al mixed crystal ratio (u−x) maybe set to 0.5 or less so as to suppress the deterioration of crystallinity by providing a barrier layer having high Al mixed crystal ratio, and may also be set to 0.3 or less which enables it to form the good well layer by suppressing the deterioration of crystallinity. In the first barrier layer and the second barrier layer made of nitride semiconductor including Al, the difference between the Al mixed crystal ratio $u_1$ in the first barrier layer and the Al mixed crystal ratio $u_2$ in the second barrier layer, $u_1-u_2$, is set to 0.02 or larger ($u_1-u_2\geq0.02$), preferably 0.05 or larger ($u_1-u_2\geq0.05$). Carrier confinement function by the first barrier layer can be achieved when the difference in the Al mixed crystal ratio in the first barrier layer, second barrier layer is 0.02 or larger, and can be made satisfactory when the difference is 0.05 or larger. That is, the higher the Al mixed crystal ratio in the first barrier layer to make the band gap energy higher, the better carrier confinement can be achieved, The lower Al mixed crystal ratio in the second barrier layer to make the band gap energy lower, the higher the efficiency of carrier injection is thereby improving the device characteristics.

In the device using the nitride semiconductor, it is preferable that at least one of the first semiconductor layer and the second semiconductor layer is made of a material comprising a nitride semiconductor including Al. This makes it possible to make a device structure having excellent crystallinity with lower Al mixed crystal ratio in the respective conductivity type layers that sandwich the active layer in the nitride semiconductor operating at short wavelengths, by providing the first semiconductor layer and the second semiconductor layer made of the nitride semiconductor including Al in the layers that sandwich the active layer that has the well layer and the barrier layer of the composition described above.

When thickness of the first barrier layer is made smaller than thickness of the second barrier layer, carrier carrier confinement by the first barrier layer and carrier injection by the second barrier layer and crystallinity of the well layer can be made satisfactory. This is because, when thickness of the first barrier layer is made large in a device consisting of the first conductivity layer, the active layer and the second conductivity type layer stacked in this order, crystallinity of the well layer formed thereon is deteriorated. By making the thickness of the second barrier layer larger than the thickness of the first barrier layer, adverse effect of the carrier confinement layer formed in proximity on the active layer can be mitigated. Specifically, while a nitride semiconductor having a high Al mixed crystal ratio is used for the carrier confinement layer that has a high band gap energy in the nitride semiconductor operating in a short wavelength region as described above, resistivity of the layer becomes high when the device is operating thereby generating heat that has adverse effect on the active layer located nearby. In the case of carrier confinement layer doped with a p-type impurity, a p-n junction is formed in the vicinity of the active layer so that adverse effect on the active layer is prevented. This is because the second barrier layer is formed between the well layer and the carrier confinement layer and serves as a spacer to prevent the adverse effect. Thus function of the active layer can be improved by forming the second barrier layer thicker than the first barrier layer. Since the injection of carrier from the first conductivity type layer is impeded when the first barrier layer is too thick, it is preferable to improve the function of the first barrier layer by increasing the band gap energy and make the thickness smaller. In the case of the first barrier layer made of the nitride semiconductor including Al, better well layer can be formed by making the Al mixed crystal ratio higher and the thickness smaller than the second barrier layer made of nitride semiconductor including Al.

In the more preferable constitution, thickness of the first barrier layer is set in a range from 30 Å (3 nm) to 150 Å (15 nm), and thickness of the second barrier layer is set in a range from 50 Å (5 nm) to 300 Å (30 nm). This constitution makes the first barrier layer capable of carrier confinement and the thickness is preferably set to 50 Å or larger which makes the structure having improved efficiency of confinement. This is because tunneling of the carrier occurs when the first barrier layer is thin as shown in FIG. 5B. Tunneling can be prevented by making the thickness 30 Å or larger, and tunneling can be effectively prevented and the efficiency of confinement can be improved by making the thickness 50 Å or larger. When the thickness of the first barrier layer is set to 150 Å or less, deterioration of crystallinity due to the nitride semiconductor that includes Al can be prevented and good well layer can be formed and, moreover, such a barrier can be made that does not impede the injection of carrier from the first conductivity type layer. As for the second barrier layer, when the second conductivity type layers 28, 29 are p-type layers, the p-n junction is formed in the vicinity of the second barrier layer 2b as shown in FIGS. 5A and 5B, and therefore location of the well layer too near the second conductivity type layer tends to impair the function of efficient recombination of carrier under the influence of the well layer. Moreover, since the carrier confinement layer 28 is located near the active layer and has a high band gap energy in the second conductivity type layer, the carrier confinement layer has a composition including Al in a higher concentration than the other layers, and therefore has higher resistance than the other layers resulting in greater heat during device operation. Accordingly, the second barrier layer 2b serves as a spacer that protects the well layer from the heat. Therefore, the thickness is set preferably to 50 Å or larger and more preferably to 80 Å or larger in order to avoid the problems described above and achieve good device characteristics. Upper limit for the thickness is set to 300 Å so as to make an under layer that supports the carrier confinement layer with good crystallinity. When thickness of the second barrier layer is larger than 300 Å, carrier from the first conductivity type layer is confined by the carrier confinement layer that is apart from the well layer, resulting in lower efficiency of carrier confinement. In order to achieve better crystallinity, the thickness is set to 200 Å or less, and excellent crystallinity can be achieved and the carrier confinement layer can be located at a preferable position when the thickness is set to 150 Å or less.

In the device structure where the cladding layers are provided apart from the active layer via the first semiconductor layer and the second semiconductor layer in the first conductivity type layer and the second conductivity type layer, it is preferable to make the band gap energy of the cladding layer formed in the first conductivity type layer higher than that of the first semiconductor layer, and to make the band gap energy of the cladding layer formed in the second conductivity type layer higher than that of the second semiconductor layer. This is because, as described above, better injection of the carrier can be achieved in a stepwise band structure by providing outside the active layer separately from the confinement of carrier in each barrier layer. Also in case a cladding layer for optical confinement is provided in an end-face light emission device such as LD, since first and second nitride semiconductor layers can be used as optical guide layers and the band gap energy is not set higher than that of the active layer unlike in the conventional device, the device can be made with relatively good lattice matching and good crystallinity. As a specific constitution, such a device as the first semiconductor layer and the second semiconductor layer are made of nitride semiconductor including Al and the Al mixed crystal ratio in the first semiconductor layer and the second semiconductor layer is set lower than that of the first barrier layer achieves excellent crystallinity in a light emitting device operating at short wavelengths. Another device constitution may be such as a light emission device 200 shown in FIG. 6A where a first conductivity type layer that includes a first semiconductor layer 202, a first barrier layer 2a, a well layer 1a, an active layer 203 (12) that has a second barrier layer 2b, a second semiconductor layer 205 and the second conductivity type layer 13 that includes the carrier confinement layer 204 that are stacked one on another on a substrate 201. FIG. 6A shows a structure where the device structure described above is provided on the electrically conductive substrate 201, an electrode 207 is provided on the back surface of the substrate and a pair of electrodes of the respective conductivity type are disposed opposing each other interposing the substrate, while FIG. 6B shows a structure where a pair of electrodes of the respective conductivity type are disposed on one side of the substrate.

In a more preferable constitution of a nitride semiconductor light emitting device where a waveguide is formed with an active layer sandwiched by optical guide layers that are provided in the first conductivity type layer and the second conductivity type layer, the optical guide layer provided in the first conductivity type layer has the first semiconductor layer. That is, the first semiconductor layer and the second semiconductor layer that have a band gap energy lower than the active layer (first barrier layer), unlike the conventional device, can be used for the optical guide layers, and a light emitting device having such a structure as the difference in lattice constant and the difference in the thermal expansion coefficient are made smaller can be made in a material based on gallium nitride. At this time, it is preferable to make the band gap energy of the guide layers lower than that of the first barrier layer, similarly to the first and second semiconductor layers, thus making a light emission device having good crystallinity with a device structure having low Al mixed crystal ratio. That is, by using the first semiconductor layer and the second semiconductor layer layers that have an Al mixed crystal ratio lower than that of the first barrier layer which is made of nitride semiconductor including Al for the optical guide layers, such a structure can be made as an Al mixed crystal ratio in the lower optical guide layer 26 and the upper optical guide layer 29 that interpose the active layer is made lower as shown in FIG. 2B, so that a device having high crystallinity and high reliability can be made by suppressing the Al mixed crystal ratio low in the active layer and the entire device.

In the active layer interposed by such optical guide layers, a device having further excellent characteristics can be obtained by making a light emitting device having a waveguide of such a structure as the cladding layer is provided as the optical confinement layer. Specifically, cladding layers for optical confinement are provided in the first conductivity type layer and the second conductivity type layer so as to interpose the optical guide layers that interpose the active layer, while the cladding layer provided in the first conductivity type layer has a band gap energy higher than that of the first semiconductor layer and the cladding layer provided in the first conductivity type layer has a band gap energy higher than that of the first semiconductor layer. This results in a light emission device of separate confinement type that has optical guide layers and the cladding layers for optical confinement, wherein the band gap energy is high in gallium nitride semiconductor material and the mix ratio of aluminum that decreases the refractive index is suppressed to a low value throughout the entire device. This enables manufacturing that ensures the crystallinity, device reliability and stacking stable, thus making it possible to decrease the variability in the device characteristics and improve the production yield. That is, by setting the Al mixed crystal ratio of the lower cladding layer 25 made of nitride semiconductor including Al higher than that of the lower optical guide layer 26 (first semiconductor layer), and setting the Al mixed crystal ratio of the upper cladding layer 30 made of nitride semiconductor including Al higher than that of the upper optical guide layer 29 (second semiconductor layer), the cladding layers for optical confinement can be made to have a refractive index lower than those of the guide layers. At this time, it is more preferable to set the Al mixed crystal ratio of the cladding layers for optical confinement lower that that of the first barrier layer 2a as shown in FIG. 2B, which makes it possible to make the device structure with Al mixed crystal ratio kept low and is preferable for forming the cladding layers with large thickness that is required for optical confinement.

In addition to the constitution described above, setting the band gap energy of the first barrier layer higher than that of the cladding layer makes it possible to form a device structure of excellent crystallinity.

The light emitting device operating at such a waveguide as described above can be used in such applications as laser device, end-face light emission device and super luminescence diode.

BEST MODE FOR CARRYING OUT THE INVENTION

Figure 1:
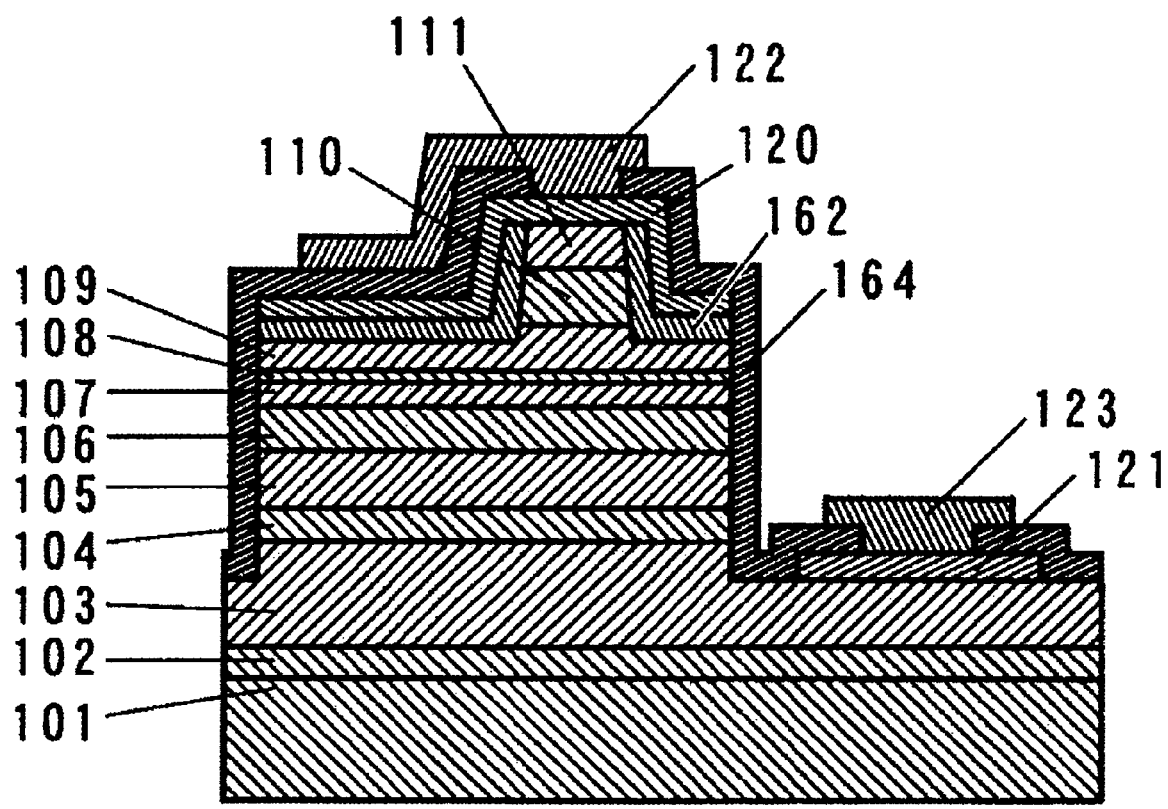
FIG. 1 is a schematic sectional view showing the laser device structure according to one embodiment of the present invention.

The semiconductor device of the present invention will now be described below by way of preferred embodiments using nitride semiconductor. It will be understood that the present application is not limited to these embodiments, and can be applied to various known semiconductor materials such as AlGaAs and AlGaP.

Nitride semiconductors used for the nitride semiconductor device of the present invention include GaN, AlN, InN and mixed crystals thereof in the form of group III–V nitride semiconductor ($In_\alpha Al_\beta Ga_{1-\alpha-\beta}N$, $0 \leq \alpha$, $0 \leq \beta$, $\alpha+\beta \leq 1$), as well as those that use B(boron) as the group III element or a mixed crystal having a part of N(nitrogen) replaced with P(phosphorus) or As as the group V element. A nitride semiconductor including Al has composition where $\beta > 0$ and a nitride semiconductor including In has composition where $\alpha > 0$. In one embodiment of the present invention, the nitride semiconductor device of wide band gap operating at short wavelengths is a device having well layer made of nitride semiconductor including GaN or Al in an active layer and has layers made of at least one nitride semiconductor including Al in a first conductivity type layer and a second conductivity type layer.

An n-type impurity used in the nitride semiconductor may be group IV element such as Si, Ge, Sn, S(sulfur), O(oxygen), Ti and Zr, or a group VI element, preferably Si, Ge or Sn, and most preferably Si. While there is no limitation to a p-type impurity, Be, Zn, Mn, Cr, Mg or Ca may be used and preferably Mg is used. Nitride semiconductors of different conductivity type are formed by adding these acceptor and donor, thereby to make the layers of different conductivity types to be described below. The first conductivity type layer and the second conductivity type layer of the present invention may have partially undoped layers and semi-insulating layers stacked thereon, and parasitic components may be partially formed in the layers of different conductivity types as an embedded layer of reverse conductivity type (current blocking layer) of a laser device.

Now various layers according to the present invention will be described below taking nitride semiconductors.

The active layer of the present invention is preferably formed in quantum well structure, and has well layer made of nitride semiconductor including GaN or Al, and barrier layers made of nitride semiconductor including Al or nitride semiconductor including In and Al. Particularly, wavelength in the active layer is 375 nm or less and specifically the band gap energy in the well layer is within wavelength 375 nm. While the nitride semiconductor used in the active layer may be undoped, doped with n-type impurity or doped with p-type impurity, preferably nitride semiconductor that is undoped or doped with n-type impurity is provided in the active layer which makes a nitride semiconductor device such as laser device or light emitting device of high output power. It is preferable that the well layer is undoped and the barrier layer is doped with n-type impurity which makes a nitride semiconductor device such as laser device or light emitting device of high output power. The quantum well structure may be either multiple quantum well structure or single quantum well structure. Preferably multiple quantum well structure is employed which makes it possible to increase the output power and lower the threshold of oscillation. The quantum well structure of the active layer may be formed from at least one well layer described above and at least one barrier layer stacked on either side of the well layer. In the case of quantum well structure, number of the well layer is at least one and not more than four which results in a low threshold current for laser device or light emission device. More preferably, multiple quantum well structure is employed where the number of the well layer is two or three which makes laser device or light emission device of high output power.

The well layer according to the present invention is preferably made of nitride semiconductor including GaN or Al. By providing at least one well layer made of nitride semiconductor including GaN or Al in the active layer and making all of the well layers described above from the nitride semiconductor for the multiple quantum well structure, light emission at a shorter wavelength can be achieved and laser device or light emitting device of high output power and high efficiency can be obtained. This constitution is preferable in the case of emission spectrum having a single peak of emission. In a multi-color light emission device that has a plurality of emission peaks, emission peak in short wavelength region can be obtained by providing at least one well layer made of the nitride semiconductor including GaN or Al, thereby making it possible to obtain a light emission device that emits light of various colors or that combines it with a fluorescent substance that is excited by the light of short wavelength. When such a multi-color light emission device, forming the well layer having a composition of $In_\alpha Ga_{1-\alpha}N$ ($0<\alpha\leq 1$) makes the well layer capable of satisfactorily emitting light over a spectrum from ultraviolet to visual region. In this case, emission wavelength can be determined by the proportion of In content. For a light emission device that employs well layer of wavelength 375 nm or longer, the well layer may be made of nitride semiconductor including In, with the composition preferably being $In_\alpha Ga_{1-\alpha}N$ ($0<\alpha\leq 1$) described above.

The well layer made of nitride semiconductor including Al operating at short wavelengths according to the present invention makes it possible to emit light of wavelength that is difficult for the conventional well layer made of InGaN, specifically wavelength of around 365 nm, that is the band gap energy of GaN, or shorter and particularly has a band gap energy that enables it to emit light of wavelength 375 nm or shorter. This is because the conventional well layer made of tertiary compound semiconductor of InGaN requires it to control the proportion of In content to within 1% for operating at wavelength of around 365 nm, for example 370 nm, with the band gap energy of GaN. With such a low proportion of In content, efficiency of light emission lowers and laser device or light emission device having a sufficient output power cannot be obtained. Moreover, when the proportion of In content is 1% or less, it is difficult to control the crystal growth. According to the present invention, a laser device operating at short wavelength can be made by using the well layer made of nitride semiconductor including GaN or Al and increasing Al mixed crystal ratio x thereby increasing the band gap energy, making it possible to emit light of wavelength 375 nm that has been difficult for the conventional well layer.

Specific composition of the nitride semiconductor including Al used in the well layer for emitting light of short wavelength is $Al_x In_y Ga_{1-x-y}N$ ($0<x\leq 1$, $0\leq y\leq 1$, $x+y<1$), and preferably tertiary compound semiconductor $Al_x Ga_{1-x}N$ ($0<x\leq 1$) and quaternary compound semiconductor $Al_x In_y Ga_{1-x-y}N$ ($0<x\leq 1$, $0<y\leq 1$, $x+y<1$) are used. A well layer made of binary compound semiconductor GaN for short wavelength may also be used.

Characteristics of the well layer made of nitride semiconductor including Al will be described in detail below. In a nitride semiconductor including In and Al, the presence of In component increases the light emission efficiency in the well layer and mitigates the strong stress generated by the nitride semiconductor including Al thereby giving variation to the piezoelectric field. When the well layer is made of nitride semiconductor including Al where the proportion of In content y is almost zero, crystallinity of the well layer can be made better since the interaction between constituent elements due to large number of elements, particularly deterioration of crystallinity due to the reaction of Al and In is suppressed in a gas phase crystal growing process such as MOCVD that is employed for growing nitride semiconductor. There is not limitation to the Al mixed crystal ratio x for nitride semiconductor including In and Al, for example $Al_x In_y Ga_{1-x-y}N$ ($0<x\leq 1$, $0<y\leq 1$, $x+y<1$), and nitride semiconductor that includes Al but does not include In, for example $Al_x Ga_{1-x}N$ ($0<x\leq 1$). Desired band gap energy and wavelength can be achieved by changing the Al mixed crystal ratio. While composition including five or more constituent elements may be employed by adding B, P, As or the like to the composition described above, quaternary compound semiconductor AlInGaN and tertiary compound semiconductor AlGaN are preferably used in order to form the well layer having good crystallinity by preventing the reaction between the elements.

In the nitride semiconductor that includes In and Al, for example $Al_x In_y Ga_{1-x-y}N$ ($0<x\leq 1$, $0<y\leq 1$, $x+y<1$), the In mix proportion y is preferably in a range from 0.02 to 0.1, and more preferably from 0.03 to 0.05. Setting this value to 0.02 or higher decreases the threshold current and improves the efficiency of light emission, and setting this value to 0.03 or higher achieves these effects more profoundly. When the value is higher than 0.1, on the other hand, crystallinity begins to deteriorate due to the reaction between the constituent elements as described above. By setting this value to 0.05 or lower, it is made possible to achieve good crystallinity, decrease the threshold current and improve the efficiency of light emission.

In a range from 365 nm to 380 nm in wavelength, a well layer including In may be used. Specific composition of the well layer formed of a nitride semiconductor may be $In_z Ga_{1-z}N$ ($0<z<1$) to obtain a desired emission wavelength. In this case specific composition of the barrier layer may be $Al_u In_v Ga_{1-u-v}N$ ($0<u\leq 1$, $0<v\leq 1$, $u+v<1$) wherein Al mix proportion u of the barrier layer become larger as the emission wavelength become shorter from 380 nm. Providing in the active layer a second barrier layer having an Al mix proportion lower than an Al mix proportion nearly equal to that of the first barrier layer in the conventional device can prevent the crystallinity from deteriorating, while providing the second barrier layer having an Al mix proportion lower than that of the first barrier layer in the same active layer causes different stresses to be applied on the lower interface and on the upper interface in the well layer including In that is interposed between both barrier layers, so that piezoelectric field due to the nitride semiconductor that includes Al is decreased and band gap strain can be mitigated and the efficiency of light emission in the well layer can be improved. In case of providing an internal barrier layer, the second barrier layer having an Al mix proportion lower than that of the first barrier layer can make the same effect as described above, where the internal barrier layer preferably has an Al mix proportion lower than that of the first barrier layer and higher than that of the second barrier layer, thereby preventing the crystallinity from deteriorating. When the internal barrier layer has the same Al mix proportion as the second barrier layer, all of the barrier layers preferably have a sufficient offset in band gap energy against the well layer.

Thickness and number of the well layers can be determined arbitrarily, for example, single-atom layer for the thickness and one or more for the number of well layers. Specifically, thickness is set in a range from 1 nm to 30 nm. With a thickness less than 1 nm, the well layer becomes difficult to function satisfactorily. A thickness larger than 30 nm makes it difficult to grow the nitride semiconductor including Al with good crystallinity, resulting in unsatisfactory device characteristics. By setting the thickness in a range from 2 nm to 20 nm, Vf and threshold current density can be decreased. From the view point of crystal growth, a layer of relatively uniform quality and less variation in the thickness can be formed when the thickness of 2 nm or more. Crystal can be grown while suppressing the occurrence of crystal defects when the thickness of 20 nm or less. More preferably, thickness of the well layer is set to 3.5 nm or more which enables it to obtain laser device or light emission device having a high output power. This is probably because thicker well layer causes recombination for light emission to occur with high emission efficiency and internal quantum efficiency for a large amount of carrier injection in such a case as laser device driven with a large current, with this effect being especially conspicuous in multiple quantum well structure. In single quantum well structure, similar effect can be achieved with a thickness of 5 nm or more. There is no limitation to the number of well layers, and any number, one or more, of well layers may be formed. When four or more well layers are provided with each layer constituting the active layer has substantial thickness, total thickness of the active layer becomes too large resulting in the Vf being too high. Thus it is desirable to keep the thickness of the well layer within 10 nm so as to restrict the thickness of the active layer. In the multiple quantum well structure, at least one of the plurality of well layers is formed to a thickness in the range described above, and preferably all of the well layers are formed to thickness in the range described above. The well layers may or may not have the same thickness.

The well layer according to the present invention may be doped with p-type impurity or n-type impurity, or may be left undoped. Impurity to dope the well layer is preferably an n-type impurity which contributes to the improvement of the efficiency of light emission. However, since nitride semiconductor including In and Al is used in the well layer that leads to unsatisfactory crystallinity as the impurity concentration increases, it is preferable to restrict the impurity concentration to a low level so as to form the well layer with good crystallinity. In order to achieve the highest possible crystallinity, the well layer is grown undoped, with the impurity concentration controlled to $5\times10^{16}$/cm$^3$ or lower that means substantially no impurity included. When well layer is doped with an n-type impurity, the impurity concentration is controlled within a range from $5\times10^{16}$/cm$^3$ to $1\times10^{18}$/cm$^3$, which suppresses the deterioration of crystallinity and increases the carrier concentration, thereby decreasing the threshold current density and Vf. At this time, concentration of n-type impurity in the well layer is preferably controlled to be equal to or lower than the concentration of n-type impurity in the barrier layer, since it tends to accelerate the recombination for light emission in the well layer and increase the optical output power. At this time, the well layers and the barrier layers may also be grown without doping so as to constitute a part of the active layer. In the case of multiple quantum well structure where a plurality of well layers are provided in the active layer, different well layers may or may not include impurity in the same concentration.

In a device driven with a large current (such as LD or LED of high output power, super photoluminescence diode, etc.), recombination of the carriers in the well layers is accelerated and light emission recombination occurs at a higher probability when the well layers are undoped and do not substantially include any n-type impurity. When the well layers are doped with the n-type impurity, in contrast, carrier concentration in the well layers increases resulting in lower probability of the light emission recombination which leads to a vicious cycle of the drive current increasing with a constant output power, and consequently causing the device reliability (lifetime of the device) to decrease significantly. For this reason, in such a high power device, the n-type impurity concentration in the well layers is kept not higher than $1\times10^{18}$/cm$^3$, and preferably the well layers are grown without doping or with such a concentration that can be regarded as including substantially no n-type impurity, which makes it possible to achieve a nitride semiconductor device capable of stable operation with high output power. In a laser device with the well layer being doped with n-type impurity, spectrum width of the peak wavelength of the laser light tends to spread and therefore the n-type impurity concentration is kept within $1\times10^{18}$/cm$^3$, and preferably $1\times10^{17}$/cm$^3$ or lower.

According to the present invention, the barrier layer is made of a nitride semiconductor that includes Al operating at short wavelengths. What is necessary is that at least one of the barrier layers formed in the active layer is made of nitride semiconductor including Al, and all the barrier layers formed in the active layer may be made of nitride semiconductor including Al or some barriers in the active layer may be made of nitride semiconductor not including Al. The barrier layer has a band gap energy higher than that of the well layer. In a region where the emission wavelength of the well layer is 375 nm or shorter, corresponding barrier layer is preferably made of nitride semiconductor including Al. A nitride semiconductor having composition of $Al_uIn_vGa_{1-u-v}N$ ($0<u\leq1$, $0\leq v\leq1$, $u+v<1$) is preferably used for the barrier layer made of nitride semiconductor including Al. Specifically, the barrier layer made of nitride semiconductor including Al maybe quaternary compound semiconductor AlInGaN where In mix proportion v in the above formula is not zero or tertiary compound semiconductor AlGaN. Proportion u of Al in the barrier layer is set to a value higher than the proportion x of Al in the well layer made of nitride semiconductor including Al, namely u>x, so as to provide a sufficient difference in band gap energy between the well layer and the barrier layer, thereby forming quantum well structure that has satisfactory light emission efficiency for laser device and light emission device. In case the barrier layer includes In (v>0), proportion v of In is preferably set to 0.1 or less so as to suppress the deterioration of crystallinity and more preferably set to 0.05 or less. When the proportion v of In is higher than 0.1, Al and In react quickly during crystal growth resulting in poor crystallinity and inability to form a good film. When the proportion is controlled to $v\leq0.05$, the barrier layer can be formed with better crystallinity. The range of proportions v of In in the barrier layer can be wider than in the well layer where recombination for light emission occurs. Also because the difference in band gap energy is ensured by means of the ratio of Al, such a proportion as $v\geq y$ may be employed. Setting the proportions of In to such a value enables it to change the critical thickness of the well layer and the barrier layer, so that the thickness can be set relatively freely in a quantum well structure and design the active layer having the desired characteristics.

As described above, the barrier layer according to the present invention can be made of nitride semiconductor including In and Al, specifically a quaternary compound semiconductor $Al_uIn_vGa_{1-u-v}N$ ($0<u\leq1$, $0<v\leq1$, $u+v<1$), nitride semiconductor including Al with In mix proportion of nearly zero, specifically $Al_uGa_{1-u}N$ ($0<u\leq1$) similarly to the well layer described above for a system of short wavelength. For a region of longer wavelengths, a nitride semiconductor including In or GaN may be used as described above, and specifically the use of $In_vGa_{1-v}N$ ($0 \leq v \leq 1$) allows broad applications to visible region from ultraviolet to red.

In the active layer of quantum well structure, the barrier layers may be formed either alternately with the well layers, or plurality of barrier layers may be provided for one well layer. Specifically, two or more barrier layers may be sandwiched by well layers with the structure having at least one first barrier layer and the second barrier layer, and such a structure may also be provided as a multiple film barrier layers and well layers are stacked alternately.

The barrier layer may be doped with a p-type impurity or an n-type impurity, or may be left undoped, similarly to the well layer described above, but is preferably doped with an n-type impurity or grown undoped. When barrier layer is doped with an n-type impurity, the impurity concentration is $5 \times 10^{16}/cm^3$ or higher. Specifically, in the case of an LED, the n-type impurity is added to a concentration in a range from $5 \times 10^{15}/cm^3$ to $2 \times 10^{18}/cm^3$. In an LED of higher output power or a high output LD, the n-type impurity is added to a concentration in a range from $5 \times 10^{17}/cm^3$ to $1 \times 10^{20}/cm^3$, or more preferably from $1 \times 10^{18}/cm^3$ to $5 \times 10^{19}/cm^3$. When the barrier layer is doped in such a high concentration, the well layer is preferably grown so as to include substantially no n-type impurity, or undoped. When barrier layer is doped with an n-type impurity, all the barrier layers in the active layer may be doped, or part of the barrier layers may be doped with the rest grown undoped. When part of the barrier layers are doped with an n-type impurity, it is preferable to dope the barrier layer located on the n-type side in the active layer. Specifically, n-th barrier layer Bn (n=1, 2, 3, ... ) counting from the n-type layer side is doped, which causes electrons to be efficiently injected into the active layer so that a device having high efficiency of light emission and high internal quantum efficiency can be obtained. This is not limited to the barrier layer, but applied also to the well layer. When both the barrier layer and the well layer are doped, n-th barrier layer Bn (n=1, 2, 3, ... ) and m-th well layer Wm (m=1, 2, 3, ... ) counting from the n-type layer side are doped. That is, the effects described above can be achieved when layers located near the n-type layer are doped.

Also as shown by embodiments to described later, when an Mg-doped p-side electron confinement-layer is provided particularly adjacent to the active layer and/or the barrier layer, doping with n-type impurity with the p-side barrier layer that is located nearest to the p-type layer side in the active layer leads to co-doping due to the diffusion of Mg, resulting in the deterioration of the active layer function. Therefore, when the Mg-doped p-side electron confinement layer is provided, the problem described above can be avoided with such a constitution as the p-side barrier layer preferably does not substantially include n-type impurity, specifically with a concentration less than $5 \times 10^{16}/cm^3$.

While there is no particular limitation to the thickness of the barrier layer, the thickness is set to 50 nm or less so as to form quantum well structure. Preferably the thickness is set in a range from 1 nm to 30 nm similarly to the case of the well layer. Deterioration of crystallinity can be prevented by restricting the thickness within 30 nm, and satisfactory function of barrier layer can be achieved by making the layer 1 nm or thicker. More preferably, the thickness is set in a range from 2 nm to 20 nm. This is because a layer of relatively uniform quality can be formed with better functionality of the barrier layer when the thickness of 2 nm or more, and good crystallinity can be achieved when the thickness of 20 nm or less.

Figure 3A:
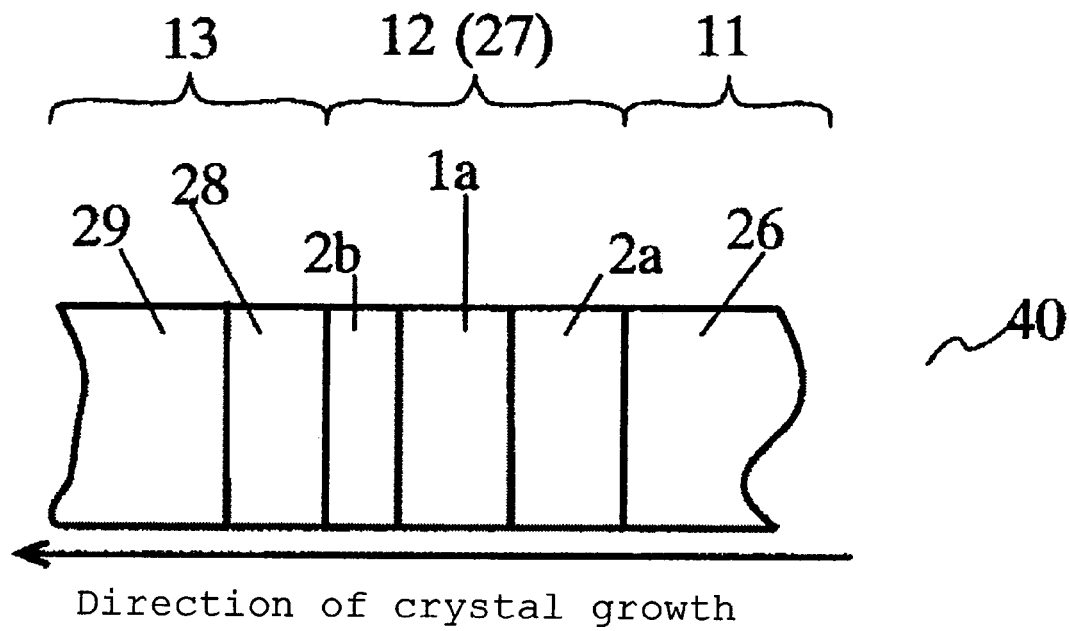
FIG. 3A is a schematic sectional view showing the stacking structure according to one embodiment of the present invention and FIG. 3B is a schematic diagram showing the band structure of biased laser device corresponding to the stacking structure.
Figure 3B:
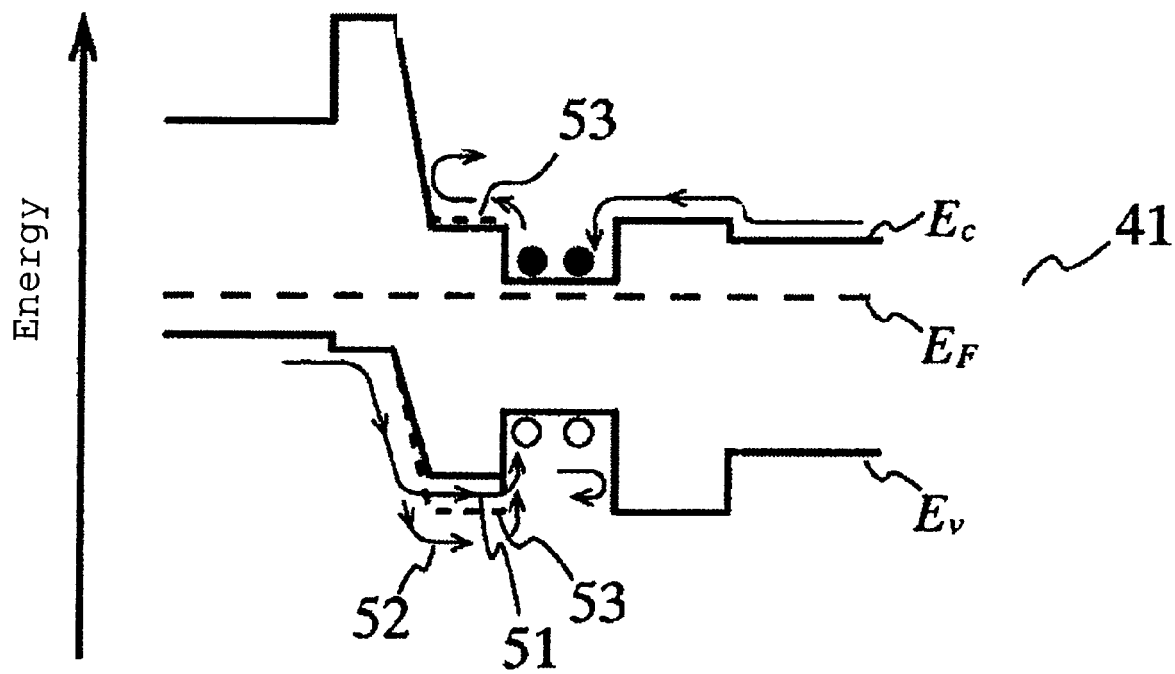

Preferred embodiment of the active layer having quantum well structure according to the present invention for light emission device operating at short wavelengths comprises at least one pair of well layer made of the binary compound semiconductor, tertiary compound semiconductor $Al_xGa_{1-x}N$ ($0 \leq x < 1$) and quaternary compound semiconductor $Al_xIn_yGa_{1-x-y}N$ ($0 < x \leq 1$, $0 < y \leq 1$, $x+y<1$), barrier layer made of quaternary compound semiconductor $Al_uIn_vGa_{1-u-v}N$ ($0 < u < 1$, $0 < v < 1$, $u+v<1$) or tertiary compound semiconductor $Al_uGa_{1-u}N$ ($0 < u < 1$). Specifically, as shown as the active layer 12 in FIGS. 3A, 3B, 5A and 5B, one or more well layers made of AlGaN or AlInGaN and two or more barrier layers made of InAlGaN or AlGaN which makes well layer having excellent internal quantum efficiency and light emission efficiency. Moreover, by controlling the Al content in the nitride semiconductor including Al, the well layer can be made capable of emitting light in the short wavelength region below 375 nm as shown in FIGS. 3A and 3B. Excellent barrier layer operating in the short wavelength region can be made by forming the barrier layer 2 having a band gap energy higher than that of the well layer 1 from InAlGaN or AlGaN.

(Active Layer and First Conductivity Type Layer, Second Conductivity Type Layer That Interpose the Same)

Now the structure of the first conductivity type layer 11 and the second conductivity type layer 13 interposing the active layer 12, particularly the relationship between the layers formed near the active layer, specifically formed to adjoin the active layer, and the active layer according to the embodiment of the present invention will be described in detail below.

Figure 2A:
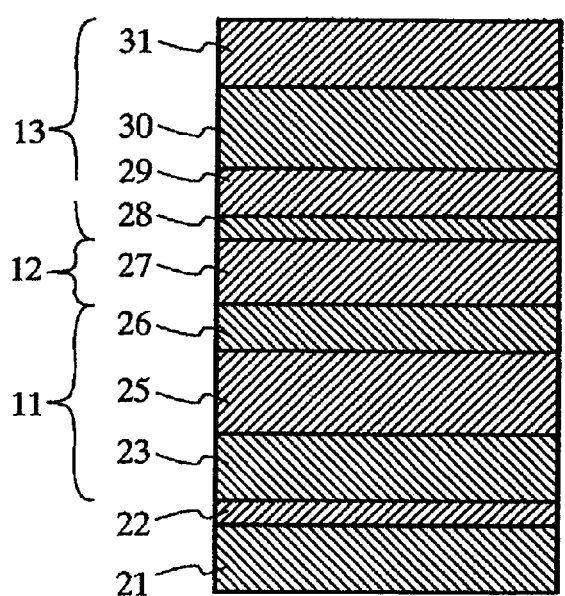
FIG. 2A is a schematic sectional view showing the stacking structure according to one embodiment of the present invention and FIG. 2B is a diagram showing the proportions of Al in the layers.
Figure 4A:
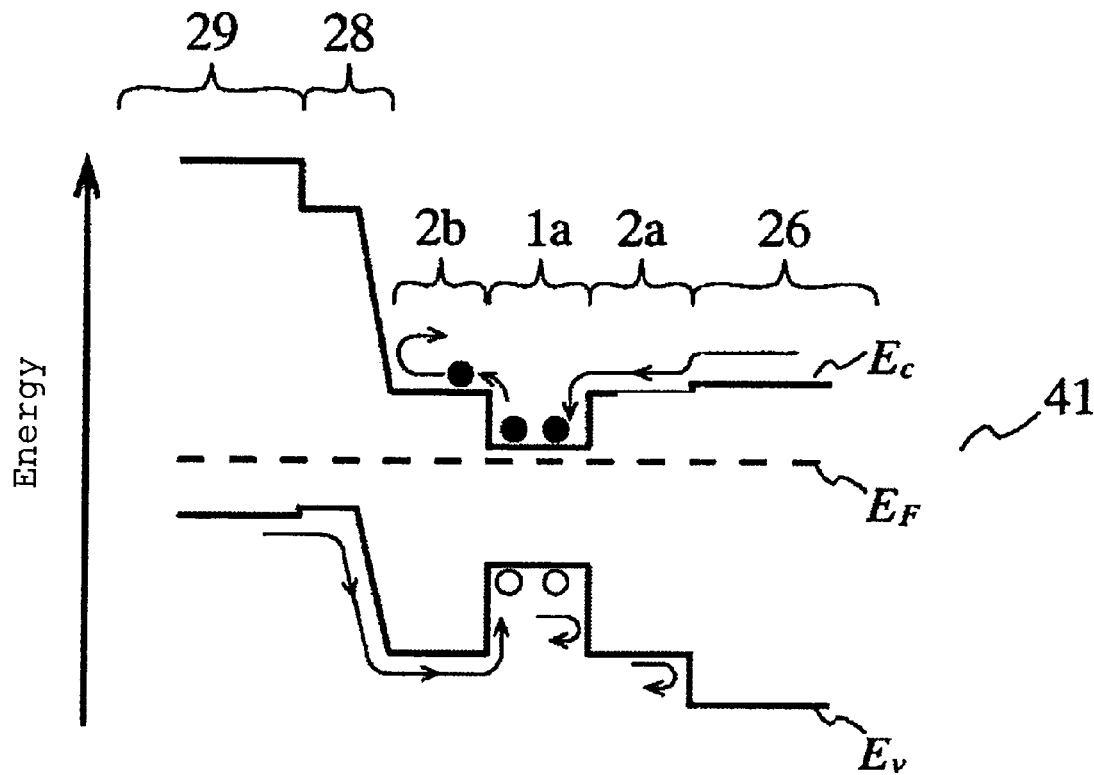
FIGS. 4A and 4B are schematic diagrams showing the conventional band structure of biased laser device.
Figure 4B:
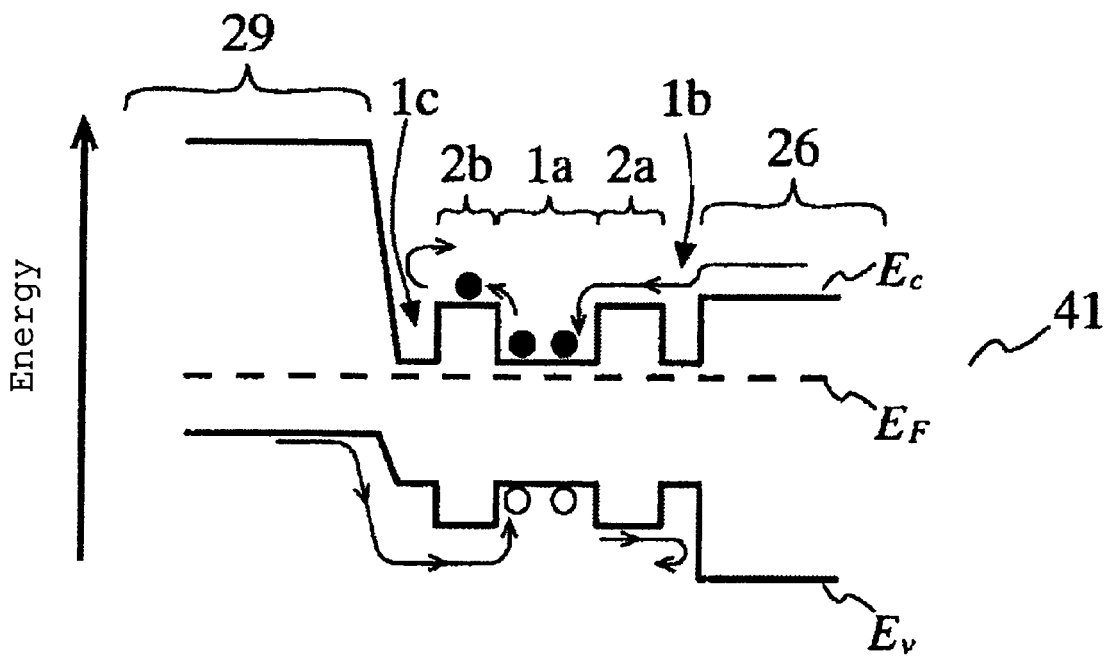
Figure 7:
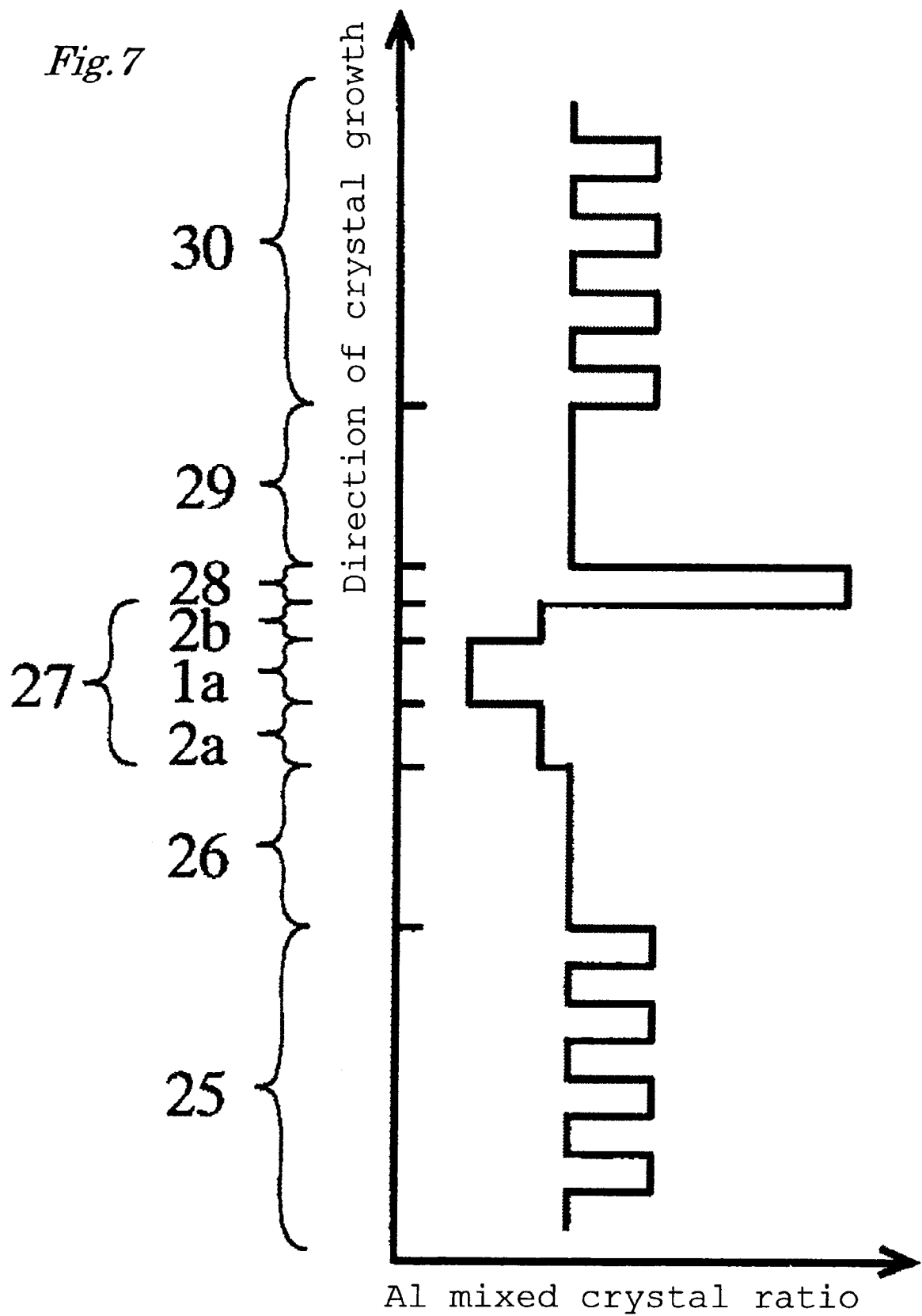
FIG. 7 is a diagram showing the relation between stacking structure and the proportions of Al in the layers in the conventional laser device.

The conventional laser device structure has the band structure shown in FIGS. 4A and 4B and variation of the Al mixed crystal ratio in the stacked layer structure of FIG. 2A shown in FIG. 7, where the band gap energy is made higher in the order from the optical guide layers 26, 29 that interpose the active layer to the cladding layers 25, 30 that interpose the former from the outside. For example, a nitride semiconductor laser device based on AlGaN/InGaN operating at wavelength 410 nm is rendered the band gap structure of the conventional laser device by replacing with the In mix proportion in active layer having a lower band gap energy in comparison to the reference point of 0 assumed for the ratio of Al in the optical guide layers 26, 29 in FIG. 7. For another conventional semiconductor laser device based on AlGaN operating at short wavelengths in the ultraviolet region, as shown in FIG. 7, such a structure has bee proposed as the Al mixed crystal ratio is increased in the order from the optical guide layers 26, 29 located outside the active layer to the cladding layers located outside, and accordingly the band gap energy is increased from the active layer to the outside as shown in FIGS. 4A and 4B. Also in the conventional nitride semiconductor laser device based on AlGaN that emits light in the ultraviolet region, such a structure as that of the laser device described above excluding the cladding layer or the optical guide layer has been proposed. Specifically, a layer having a high band gap energy has been formed by making the ratio of Al higher than in the light emitting layer (active layer 27) in a structure where the optical guide layers 26, 29 and the cladding layers 25, 30 shown in FIG. 7 are used for the carrier confinement layer. However, in such a structure as the ratio of Al is increased progressively toward the outside, deterioration in crystallinity and occurrence of cracks have been causing serious problems.

Figure 2B:
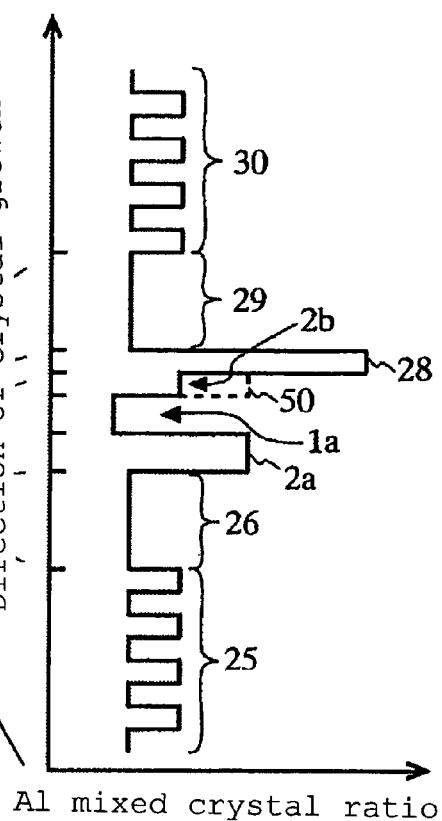

According to the present invention, occurrence of cracks that accompany the conventional structure described above is suppressed and continuous oscillation at the room temperature is enabled by making such a structure as the band gap energy is made lower and the Al mixed crystal ratio is decreased in the optical guide layers 26, 29 that sandwich the active layer 27 than in the barrier layer 2 provided in the active layer as shown in FIGS. 2A and 2B. Specifically, the first semiconductor layer 26 is formed in the first conductivity type layer, and the band gap energy is made lower than in the barrier layer, particularly in the first barrier layer 2a provided in the active layer so that the Al mixed crystal ratio in the first semiconductor layer is made lower than in the barrier layer in the active layer operating in short wavelength region. At this time, relationship between the well layer and the first semiconductor layer is made such that the band gap energy in the first semiconductor layer is made higher than in the well layer located in the active layer in order to cause recombination for light emission. This relationship can also be applied to the second conductivity type layer. Specifically, the band gap energy is made lower and the Al mixed crystal ratio is decreased in the second semiconductor layer 29 provided in the second conductivity type layer than in the barrier layer 2 provided in the active layer. By arranging the first semiconductor layer (second semiconductor layer) having an Al mixed crystal ratio lower than in these barrier layers near the active layer, preferably so as to adjoining the active layer, the active layer having good carrier confinement characteristic and good crystallinity can be formed. When these layers are used in the optical guide layer, waveguide structure suitable for short wavelength region can be formed. This will be described in detail below.

The nitride semiconductor device according to one embodiment of the present invention has such a structure as shown in FIGS. 2A and 3A where the active layer 12 is provided between the first conductivity type layer 11 and the second conductivity type layer 13. Specifically, a contact layer 23, a lower cladding layer 25 and a lower optical guide layer 26 are stacked successively as the first conductivity type layer 11, upon which an active layer 27 is formed and a carrier confinement layer 28, an upper optical guide layer 29, an upper cladding layer 30 and a contact layer 24 are stacked successively as the second conductivity type layer 13 on the active layer. Arrangement of the carrier confinement layer, the optical guide layer, the upper cladding layer and the contact layer that adjoin each other is not limited to the contacting configuration shown in the FIG. 2A, and these layers may be separated by other layer interposed therebetween. FIG. 2A is sectional view showing the stacked structure of the device that has the waveguide structure according to the present invention. FIG. 3A shows a stacked structure 40 of the active layer and the layers disposed to interpose the active layer and FIG. 3B shows a band structure 41 that is biased in correspondence to the stacked structure 40, where the first conductivity type layer 11 is set to the n-type layer side and the second conductivity type layer 13 is set to p-type layer side. The same applies to the band structure 41 shown in FIGS. 4A, 4B, 5A and 5B where empty circle denotes hole and black circle denotes electron carrier. Arrow is used to schematically indicate the movement of the carrier, and arrow that is turned around reverse indicates the confinement of carrier by band offset. Solid line shows the conduction band $E_C$ and valence band $E_V$, and dashed line shows the Fermi level $E_F$. As will be seen from FIG. 3A, the first semiconductor layer, second semiconductor layer having lower band gap energy than the barrier layers 2a, 2b that interpose the well layer 1 are disposed to interpose the active layer and are used as the upper and lower optical guide layers. In this case, the carrier confinement layer 28 is provided in the second conductivity type layer (p-type layer side) near the active layer, preferably adjacent thereto, between the second conductivity type layer 29 and the active layer 27. Thus hole due to the barrier layer 2a in the active layer is confined in the well layer, and electron is confined in the carrier confinement layer 28 that adjoins the barrier layer 2b and/or the active layer 27. In the conventional band structure shown in FIGS. 4A and 4B, offset for carrier confinement is provided between the first conductivity type layer 26 and the active layer 27, the barrier layer 2a, while a nitride semiconductor layer or the optical guide layer 26 that has a band gap energy higher than the active layer 27 and the barrier layer 2a is provided so as to adjoin the active layer and functions as the carrier confinement layer. However, the first semiconductor layer 26 that adjoins the active layer 27 and the barrier layer 2a is not made in such a structure that confines the carrier in the active layer, and the carrier is confined in the well layer 1a by the first barrier layer 2a located nearest to the first conductivity type layer.

Now the relationship between the well layer, the barrier layer and the first semiconductor layer (the second semiconductor layer) will be described below. The nitride semiconductor device of the present invention has such a structure as the first conductivity type layer, the active layer and the second conductivity type layer are stacked as described above. Such a configuration will be described here as the first conductivity type layer is an n-type layer having n-type nitride semiconductor and the second conductivity type layer is a p-type layer having p-type nitride semiconductor. In the active layer of quantum well structure, the n-type barrier layer located nearest to the n-type layer is denoted as the first barrier layer and the p-type barrier layer located nearest to the p-type layer is denoted as the second barrier layer. According to the present invention, the band gap energy of the first semiconductor layer is preferably higher than the first barrier layer in the relation to the first semiconductor layer provided in the first conductivity type layer (n-type layer) near the n-side barrier layer. The active layer of the present invention has at least the first barrier layer, the second barrier layer having a band gap energy lower than that of the former, and at least one well layer interposed between thereof. It is necessary to place the second barrier layer nearer to the first conductivity type layer (n-type layer) than the well layer, and place the second barrier layer nearer to the second conductivity type layer (p-type layer). Therefore, it is preferable to provide the second barrier layer (p-type barrier layer) located nearer to the p-type layer than at least one well layer, so as to interpose the well layer between at least the first barrier layer and the second barrier layer. This is because the first barrier layer and the second barrier layer provided to interpose the well layer are the barrier layers provided at positions nearest to the n-type layer and nearest to the p-type layer, respectively, and have different functions.

The first barrier layer is the barrier layer provided at a position nearest to the n-type layer in the active layer, and is preferably provided at a position nearest to the n-type layer, and is outermost in the active layer. More preferably, the first barrier layer is provided in contact with the n-type layer and the first semiconductor layer. This is because, when the first barrier layer is provided apart from the n0type layer via the well layer, in the embodiment shown in FIG. 4B, for example, carrier is injected in the well layer that is located on the n-type layer side than the first barrier layer 2a, so as to cause carrier to over flow to the n-type layer side, while suppressing the to over flow to the n-type layer side by making the first barrier layer thicker makes it impossible to inject the carrier into the well layer located on the n-type layer side, thereby impairing the function of the well layer to effect recombination for light emission. In contrary, the first barrier layer functions as a barrier to confine the carrier in the well layer located in the active layer interposed by the first barrier layer and the p-type layer, and the second barrier layer also functions as a barrier to confine the carrier in the well layer interposed by the second barrier layer and the n-type layer. On the other hand, the barrier layers interposed by the well layer, for example the barrier layers 2c, 2d shown in FIGS. 5A and 5B, have the function to confine the carrier while dispersing the carrier among the well layers, different from the function of the barrier layer located between the first barrier layer, second barrier layer and the well layer. Therefore, in order to make maximum use of the function of the first barrier layer, it is necessary to satisfactorily confine the carrier in the active layer by locating the first barrier layer, second barrier layer at outermost positions in the active layer.

As to the second barrier layer, in addition to this second barrier layer as described above, the carrier can be confined in the well layers provided in correspondence to the asymmetrical barrier layer structure in the active layer, by providing the carrier confinement layer to be described later on the outside of the active layer, preferably in contact with the active layer, in the second conductivity type layer (p-type layer). Thus by locating the carrier confinement layer outside the active layer in addition to the second barrier layer, it is made possible to confine and inject the carrier satisfactorily in the active layer, particularly in the well layer, through amelioration of the problem that electron is easier to diffuse in the nitride semiconductor and has longer distance of diffusion than hole. Similarly to the first barrier layer, the second barrier layer is located nearer to the p-type layer (the first conductivity type layer) than the well layer, more preferably located nearest to the p-type layer, and is most preferably located at a position nearest to the p-type layer, and is outermost in the active layer, which enables satisfactory injection of carrier. While, the second barrier layer may also be located apart from the carrier confinement layer, preferably the second barrier layer is formed in contact with the carrier confinement layer 28 in the p-type layer, so that injection of carrier into the well layer by the second barrier layer having a band gap energy lower than the first barrier layer is promoted against the carrier confinement layer that has a band gap energy higher than the first barrier layer.

Figure 5A:
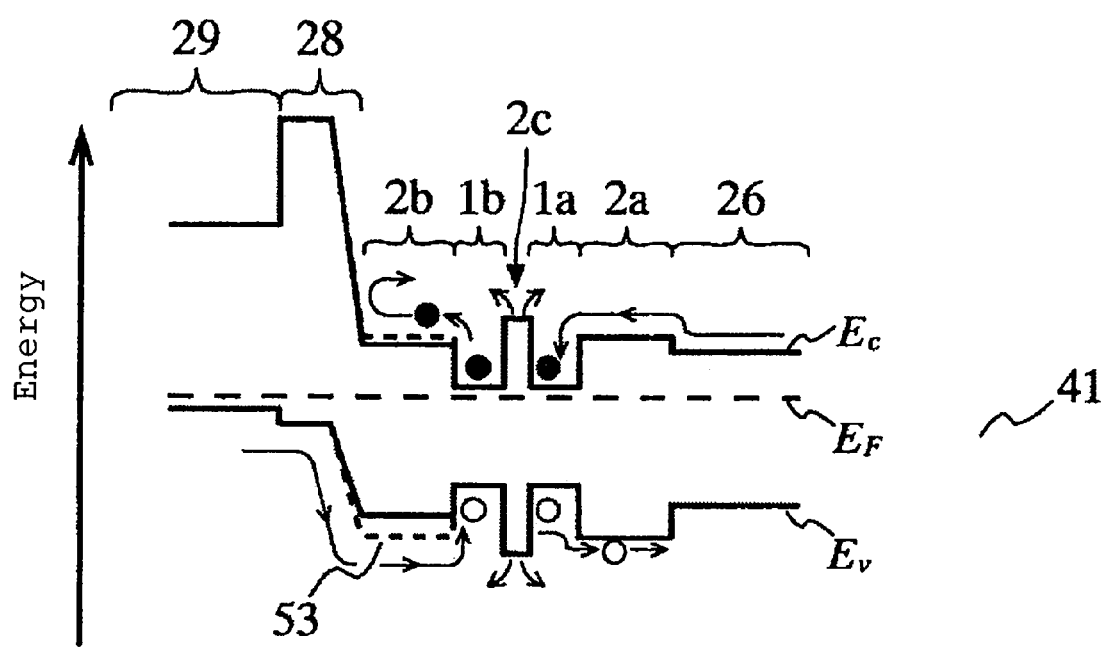
FIGS. 5A and 5B are schematic diagrams showing the band structure of biased laser device according to one embodiment of the present invention.
Figure 5B:
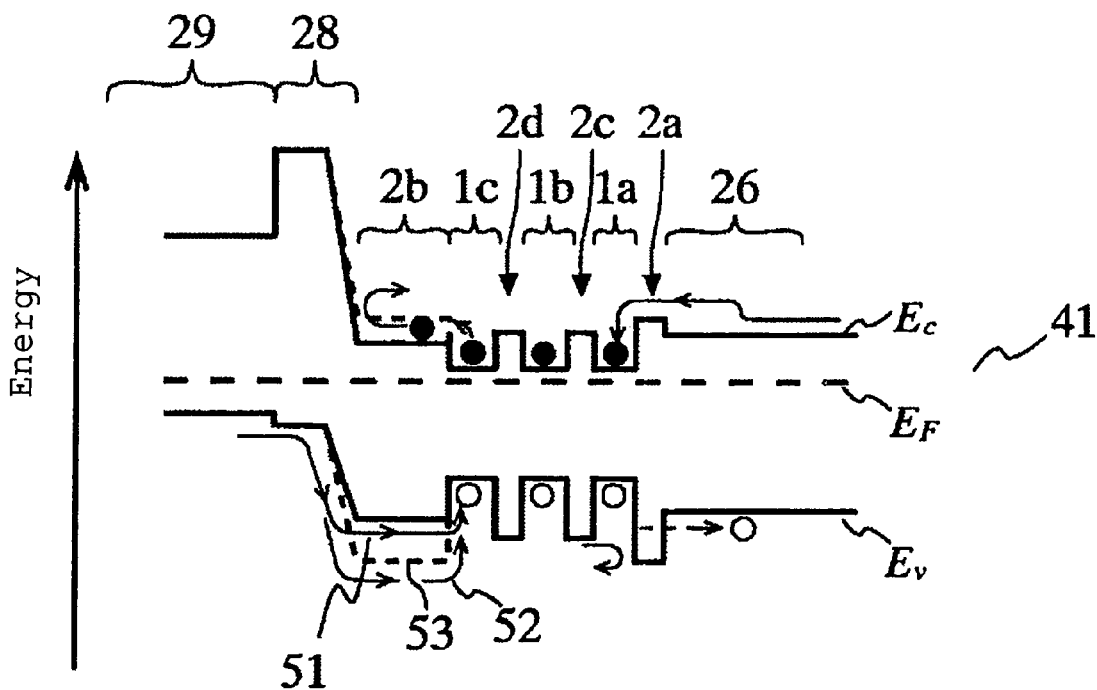

Barrier layers, other than the outermost barrier layers among the barrier layers formed in the active layer, such as the first barrier layer and the second barrier layer located near the first conductivity type layer and the second conductivity type layer than the well layer in the active layer, may be provided with internal barrier layers 2c, 2d interposed by the well layer 1a and well layer 1b, and the well layer 1b and the well layer 1c as shown in FIGS. 5A and 5B. In the case of multiple quantum well structure, in particular, the carrier can be satisfactorily distributed among the plurality of well layers, injected and confined therein by using the internal barrier layers interposed by the well layers. Namely, the internal barrier layers have different function from that of the first barrier layer and the second barrier layer, and can be made thinner than the first barrier layer and the second barrier layer to make the quantum well structure without compromising the function of the barrier layer interposed by the well layers, which is advantageous for restricting the thickness of the entire active layer and suppressing Vf from increasing. Also as shown in FIG. 5A, when the internal barrier layer 2c is formed to have a band gap energy higher than that of the first barrier layer and the second barrier layer, the carrier injected from the respective conductivity type layer that adjoin the active layer must overcome the greater internal barrier layers 2c, 2d located between the well layers, resulting in lower efficiency of injecting the carrier into the well layer located on the first conductivity type layer by overcoming the internal barrier layer. When the barrier layers 2c, 2d interposed by the well layers are formed with a band gap energy lower than the first barrier layer, second barrier layer as shown in FIG. 5B, confinement function of the barrier layer located at the inner positions is weakened and the function of the first barrier layer, second barrier layer located outside is made stronger relative to these barrier layers. Therefore, the outer barrier layers provide a larger barrier even when the number of well layers is increased, so that satisfactory injection and confinement of the carrier into the well layers can be achieved. That is, by making the band gap energy of the internal barrier layers lower than that of the first barrier layer as shown in FIG. 5B, the first barrier layer that is located furthest is given the highest band gap energy so that the carrier from the second conductivity type layer can be injected satisfactorily into the well layers. It is preferable to make the band gap energy of the internal barrier layer than that of the second barrier layer, so that the band gap energy of the barrier layers increases stepwise from the first conductivity type layer toward the second conductivity type layer which enables satisfactory injection of carrier into the well layers, as shown in FIG. 5B.

As described above, since the first barrier layer and the second barrier layer that are outer barrier layers have different function from the barrier layer interposed by the well layer located inside, device having desired characteristic can be made in a structure where film thickness, band gap energy and the composition are made different between the internal barrier layers and the outer barrier layers. Also as shown in FIG. 5B, it is also possible to make the film thickness, band gap energy and the composition different between the internal barrier layers in an active layer that has a plurality of internal barrier layers or, alternatively, film thickness, band gap energy and the composition may be almost the same. Preferably substantially uniform function is rendered to the internal barrier layers by making the film thickness, band gap energy and the composition almost the same, thereby enabling satisfactory injection of carrier into the well layers.

For the reason described above, the first barrier layer 2b located nearest to the n-type layer side is preferably doped with an n-type impurity and the second barrier layer located nearest to the p-type layer side is preferably substantially not doped with any n-type impurity, with impurity concentration of $5 \times 10^{16}/cm^3$ or less. This is because many of p-type impurities used in nitride semiconductors have high tendency of diffusion, for example Mg and Zn that are commonly used can diffuse far in a stacked structure. Thus when the barrier layers are doped with p-type impurity, the impurity diffuses into the adjoining well layer thereby impeding the recombination of the carrier for light emission in the well layer. It is preferable to grow the second barrier layer located near the p-type layer undoped which has an effect of restraining the diffusion of the impurity from the p-type layer within the barrier layer, thereby preventing the further diffusion of the impurity into the well layer. Particularly in case there is the carrier confinement layer 28 in the p-type layer disposed near the second barrier layer, preferably in contact with the second barrier layer, since the carrier confinement layer tends to have a relatively high resistance, there is a tendency to be heavily doped with p-type impurity. Thus the diffusion of this impurity becomes a problem, which can be solved by growing the second barrier layer undoped thereby preventing the function of the well layer from deteriorating due to the diffusion. Also because a p-n junction is formed in the vicinity of the carrier confinement layer and the carrier confinement layer tends to be formed with the highest Al mixed crystal ratio in the device as shown in FIGS. 3A, 3B, 5A and 5B, a high piezoelectric voltage is applied by the nitride semiconductor of high Al mixed crystal ratio, resulting in adverse effect on the well layer, which can be suppressed by growing the second barrier layer that has an Al mixed crystal ratio lower than that of the carrier confinement layer undoped.

When the first barrier layer is made thicker than the second barrier layer, by providing the carrier confinement layer 28 in the second conductivity type layer so as to decrease the carrier confinement function into the active layer by the second barrier layer, that is as the barrier layer that functions similarly to the internal barrier layer with the carrier confinement layer 28 to form a structure that achieves the carrier confinement mainly into the active layer, thus making it possible to decrease the thickness of the entire active layer thereby contributing to the decrease of Vf and, in the nitride semiconductor, since the diffusion length of hole is sufficiently short compared to the diffusion length of electron and the first barrier layer that serves as the injection port for hole is thin, carrier injection into the well layer can be done efficiently and is preferable. On the other hand, in case the carrier confinement layer 28 doped with the p-type impurity is provided, or the second semiconductor layer 29 located near the active layer, preferably in contact with the active layer, has a band gap energy higher than the first barrier layer, a layer having high Al mixed crystal ratio is located adjacent to the active layer. Since a layer having high Al mixed crystal ratio has a high resistance, significant heat is generated in this layer when the device is operating, thus causing adverse effect to the well layer resulting deterioration of the device characteristics in case this layer is near the well layer. In case a p-n junction is formed in the interface between such a layer having high Al mixed crystal ratio and the active layer, or on the active layer side of the layer having high Al mixed crystal ratio or in the vicinity thereof or a well layer of the active layer is provided, as shown in FIGS. 3A, 3B, 5A and 5B, bias tends to have an adverse effect on the recombination for light emission in the well layer. That is, the first barrier layer is preferably caused to serve as a spacer for separating the well layer and the layer having high Al mixed crystal ratio thereby to prevent the adverse effect of the layer having high Al mixed crystal ratio from affecting the well layer. In this case, thickness of the first barrier layer is 20 Å or greater which makes it possible to achieve the spacer function, and preferably 40 Å or greater which suppresses the influence on the well layer.

Now one embodiment of the present invention will be described below.

In the device structure of the present invention, an active layer of quantum well layer is interposed by the first conductivity type layer and the second conductivity type layer, where the active layer, the first conductivity type layer and the second conductivity type layer are made of nitride semiconductor. Specifically, as shown in FIG. 2A, the device has such a structure as the first conductivity type layer 11, the active layer 12 and the second conductivity type layer 13 are stacked on the substrate 21, where the active layer is made in quantum well structure having at least barrier layer and well layer. The active layer made in quantum well structure between the first conductivity type layer and the second conductivity type layer has, as shown in the stacked structure of FIG. 3A, the first barrier layer 2a located on the first conductivity type layer 11 side, the second barrier layer 2b located on the second conductivity type layer 13 side and at least one well layer 1 interposed between the first barrier layer 2a and the second barrier layer 2b. In particular, the first barrier layer 2a and the second barrier layer 2b are preferably barrier layers located on the side of the first conductivity type layer and the second conductivity type layer, respectively, and are located at outermost positions in the active layer. This means that the inner barrier layers 2c, 2d located inside have functions different from those of the first barrier layer 2a and the second barrier layer 2b as shown in FIGS. 5A and 5B.

The present invention has such a feature that, in the active layer that has the barrier layers as described above, the second barrier layer 2b has a band gap energy lower than that of the first barrier layer 2a. Specifically, as shown in FIGS. 3A, 3B, 5A and 5B, since the second barrier layer 2b has a band gap energy lower than that of the first barrier layer 2a, the path 51 of injecting the carrier from the second conductivity type layer 13 meets lower barrier than the path 52 of the conventional device does, as indicated by arrow in the drawing, thus enabling efficiency injection of the carrier into the well layer 1a. The carrier on the second conductivity type layer 13 side is confined in the well layer 1a by the first barrier layer 2a on the first conductivity type layer 11 side that has a higher band gap energy. It is preferable that the first conductivity type layer 11 is n-type layer and the second conductivity type layer 13 is p-type layer, which causes a higher barrier to be formed on the valence band side compared to the conduction band side as shown in FIGS. 3A, 3B, 5A and 5B, thus achieving satisfactory injection and confinement of hole even with a thin film such as the barrier layer and a low barrier in a system that allows shorter diffusion length for hole than electron as the nitride semiconductor. Moreover, in the device structure of the n-type layer side 11 and the p-type layer side 13, a p-n junction tends to be formed near the interface between the active layer and the p-type layer 13 in the nitride semiconductor device as shown in FIGS. 3A, 3B, 5A and 5B, and consequently the higher band gap energy of the second barrier layer 2b tends to make the barrier against hole injection higher.

When considering the confinement of electrons in the device structure where the active layer is provided between the n-type layer side 11 and the p-type layer side 13, the p-n junction described above is formed near the carrier confinement layer 28 by providing the carrier confinement layer 28 for confining electron near the active layer in the p-type layer 13 as shown in FIGS. 3A, 3B, 5A and 5B, a barrier suitable for confining electrons is formed that is preferably used in conjunction with the barrier layer described above. More preferably, the carrier confinement layer 28 is formed in contact with the second barrier layer 2b that is provided as the outermost layer on the second conductivity type layer 13 side in the active layer 27 as shown in FIG. 3A, in which case a structure for satisfactorily confining the carrier from the first conductivity type layer 11 side that is difficult to confine with the second barrier layer 2b having low barrier.

One embodiment of the present invention is employed in combination with the first embodiment. Specifically, the first semiconductor layer 26 having a band gap energy lower than that of the first barrier layer 2a is provided on the first conductivity type layer 11 side as shown in FIGS. 3A, 3B, 5A and 5B, and the second semiconductor layer 29 having a band gap energy lower than that of the first barrier layer 2a is also provided on the second conductivity type layer 13 side. When providing the second semiconductor layer 29 on the second conductivity type layer 13, it is preferable to provide the second semiconductor layer 29 apart from the active layer via the carrier confinement layer 28, namely to provide the carrier confinement layer 28 between the second semiconductor layer 29 and the active layer 12.

When the nitride semiconductor layer, having a band gap energy lower than that of the active layer 12, particularly the first barrier layer 2a that has the highest band gap energy in the active layer 12, is provided on the first conductivity type layer 11 and the second conductivity type layer 13 that interpose the active layer 12, characteristics of the light emitting device operating at short wavelengths can be improved. This is because, in the conventional nitride semiconductor light emitting device operating at short wavelengths, as described above in FIGS. 4A and 4B, it is necessary to provide a layer having a band gap energy higher than that of the active layer, namely a layer having higher Al mixed crystal ratio, which deteriorates the crystallinity due to the effect of the difference in thermal expansion coefficient or the like. According to the present invention, unlike the conventional device, the active layer, device having good crystallinity can be formed by providing the layer that has a band gap energy lower than that of the active layer is provided on the first conductivity type layer 11 and the second conductivity type layer 13 that interpose the active layer 12. Also as shown in Example, in the device made by forming the first conductivity type layer 11, the active layer 12 and the second conductivity type layer 13 in this order, the active layer having good crystallinity can be formed by suppressing the Al mixed crystal ratio in the first conductivity type layer 11 located under the active layer 12. Also by providing the layer that has Al mixed crystal ratio lower than that of the active layer 12, particularly the first barrier layer 2a on the first conductivity type layer, second conductivity type layer that interpose the active layer, it is made possible to mitigate the strong stress applied to the active layer by the nitride semiconductor including Al and form the active layer that has higher capability to drive he device.

Now the layers used in the device of the present invention will be described in detail below by way of embodiments for short wavelength applications.

(Laser Device, Waveguide Structure)

An embodiment of the present invention is a laser device, end-face light emitting device having such a nitride semiconductor structure as the active layer is interposed between first conductivity type layer, second conductivity type layer. Specifically, as shown in FIG. 2A, the first conductivity type layer 11, the active layer 12 and the second conductivity type layer 13 are stacked on the substrate, and at least the first optical guide layer 26 is provided in the first conductivity type layer 11 and the second optical guide layer 29 is provided in the second conductivity type layer 13 so as to interpose the active layer by the first and second optical guide layers 26, 29, while forming a waveguide from the first and second optical guide layers and the active layer provided therebetween. Moreover, in case the first conductivity type layer 11 has the lower cladding layer 25 and the second conductivity type layer 13 has the upper cladding layer 30, the region that includes the active layer and is interposed by the upper and lower cladding layers 25, 30 becomes the waveguide. When an optical guide layer is provided in the waveguide interposed by the upper and lower cladding layers 25, 30, threshold current density decreases and laser device having high output power is obtained. Such a device structure will be described below that is provided with optical guide layer in the waveguide operating at short wavelengths of wide band gap configuration having a band gap energy of the well layer approximately equal to or higher than that of GaN.

In the first embodiment of the present invention, as shown in FIG. 2A, the active layer 12, the first optical guide layer 26 provided in the first conductivity type layer 11 and the second optical guide layer 29 provided in the second conductivity type layer 13 are provided as the waveguide, so that the device has such a structure as the waveguide is provided employing the active layer operating at wavelength of 380 nm or shorter described above.

The waveguide is mainly intended to guide light from the active layer. Efficiency of light emission, threshold current density and other characteristics of the laser device, end-face light emitting device vary depending on the waveguide structure. While the optical guide layers are formed so as to interpose the active layer as described above, it may suffice to provide an optical guide layer on at least one of the first conductivity type layer, second conductivity type layer, namely to provide either the first optical guide layer or the second optical guide layer. However it is preferable to provide the optical guide layers on both sides of the active layer, so that threshold current density decreases and the laser device having high output power is obtained.

For the first optical guide layer 26 and the second optical guide layer 29 according to the present invention, nitride semiconductor including Al is used. Also as indicated as the band structure 41 in FIGS. 3B, 5A and 5B, the waveguide is made by setting the band gap energy higher than at least that of the well layer 1 in the active layer 27 of the quantum well structure and making the difference in refractive index between the active layer 27 and the optical guide layers 26, 29. The optical guide layers 26, 29 may all have band gap energies lower than that of the barrier layer as shown in FIGS. 3B, 5A and 5B, or a layer larger than the barrier layer may be provided as part of the optical guide layer as shown in FIGS. 4A and 4B. In this case, the optical guide layer except for the first barrier layer, or at least a part thereof, may be given a band gap energy higher than that of the barrier layer, or the band gap energy of the optical guide layer may be made higher than that of the internal barrier layer, the second barrier layer, namely a part of the barrier layers provided in the active layer as shown in FIG. 5B. That is, it is preferable that the optical guide layer has the first semiconductor layer having a band gap energy lower than that of the first barrier layer, and more preferably all the optical guide layers have band gap energies lower than that of the first barrier layer in the optical guide layer comprising the first semiconductor layer or in the multiple-film optical guide layer that has layers other than the first semiconductor layer, which makes it possible to satisfactorily achieve the function of the first barrier layer as carrier confinement layer. When the optical guide layer having a low Al mixed crystal ratio is formed so as to form the lower optical guide layer is formed thereby, for example, light emitting device, laser device having good characteristics can be made by forming the good well layer by suppressing the deterioration of crystallinity due to the nitride semiconductor including Al. At this time, it is more preferable to make the band gap energy of a part or preferably the whole of the optical guide layer lower than that of the internal barrier layer and more preferably lower than that of the first barrier layer which makes more excellent device. That is, in the system operating at short wavelengths described above, the Al mixed crystal ratio of part or is preferably the whole of the optical guide layer that is made of nitride semiconductor including Al lower than that of the internal barrier layer and more preferably lower than that of the second barrier layer. Alternatively, such a constitution may also be employed as the first semiconductor layer is provided such that, similarly to providing the optical guide layer in the first conductivity type layer 11, when the optical guide layer is provided in the second conductivity type layer 13, the second semiconductor layer having a band gap energy lower than that of the second barrier layer may also be provided, the effect of which is similar to that of the first semiconductor layer. Further more, when the second semiconductor layer is provided in the upper optical guide layer, the optical guide layer is made specifically in composition of semiconductor $In_\alpha Al_\beta Ga_{1-\alpha-\beta} N$ ($0 \leq \alpha$, $0 < \beta$, $\alpha+\beta \leq 1$). Preferably the nitride semiconductor does not include In, namely proportion of In content in the nitride semiconductor is set to zero, so as to prevent the absorption of light that occurs in the presence of In thereby forming the waveguide where optical loss is suppressed to a low level. Preferably $Al_\beta Ga_{1-\beta} N$ ($0 \leq \beta \leq 1$) is used, which makes the waveguide that can be applied to a broad wavelength region ranging from ultraviolet to infrared spectrum. In order to guide light of short wavelength not longer than 380 nm, in particular, $Al_\beta Ga_{1-\beta} N$ ($0 < \beta \leq 1$) is preferably used. This is because GaN absorbs the light in the short wavelength region described above, thus resulting in optical loss that has adverse effect on the threshold current density and current-optical output characteristics. The proportion $\beta$ of Al in the optical guide layer, in particular, is preferably set so that the band gap energy $E_g$ of the optical guide layer is 0.05 eV or more higher than the photon energy $E_p$ of the light emitted from the active layer ($E_g - E_p \geq 0.05$ eV). This makes the waveguide where optical loss by the guide layer is suppressed in the short wavelength region described above. More preferably, the energy gap is set to $E_g - E_p \geq 0.1$ eV, which enables it to obtain excellent waveguide. Thus the waveguide that allows excellent device characteristic can be formed by meeting the condition described above and forming the optical guide layer having a band gap energy lower than that of the first barrier layer.

Either one or both of the first optical guide layer 26 and the second optical guide layer 29 may be formed in a single film or a multi-layer film. When forming the optical guide layer made in a single film of nitride semiconductor, the stacking structure 40 of the first optical guide layer 26 and the second optical guide layer 29 that interpose the active layer 27 is formed as shown in FIG. 3A, the band structure of which is made such that the band gap energy becomes higher than that of the active layer. Specifically $Al_\beta Ga_{1-\beta} N$ ($0 \leq \beta \leq 1$) described above is used. In the short wavelength region described above, $Al_\beta Ga_{1-\beta} N$ ($0 < \beta \leq 1$) is used, and more preferably the proportion $\beta$ of Al in the first optical guide layer and the second optical guide layer is controlled so that the band gap energy $E_g$ of the first optical guide layer and the second optical guide layer is 0.05 eV or more higher than the photon energy $E_p$ ($E_g - E_p \geq 0.05$ eV, preferably $E_g - E_p \geq 0.1$ eV).

There is no limitation to the thickness of the first optical guide layer 26 and the second optical guide layer 29. Specifically, the thickness is in a range from 10 nm to 5 μm, preferably from 20 nm to 1 μm, and more preferably from 50 nm to 300 nm. When the layer is 10 nm or more thick, it functions as a guide layer and, when 20 nm or more thick, such a waveguide can be formed that decreases the threshold current density and, when the layer is 50 nm or more thick, the threshold current density decreases further. When the layer is 5 μm or thinner, it functions as a guide layer and, when it is 1 μm or thinner, such a waveguide can be formed that decreases the optical loss and, when it is 300 nm or thinner, the optical loss can be decreased further.

The optical guide layer may be formed from nitride semiconductor in a multi-layer film, in which case a nitride semiconductor does not include In is preferably used as described above. Moreover, $Al_\beta Ga_{1-\beta} N$ ($0 \leq \beta \leq 1$) is used and, in the short wavelength region described above, $Al_\beta Ga_{1-\beta} N$ ($0 \leq \beta \leq 1$) is preferably used. This nitride semiconductor is used so as to make the multi-layer film where nitride semiconductor layers of different compositions are formed, at least one, in each optical guide layer. Specifically, a first layer and a second layer that is different from the first layer are used in the first optical guide layer 26, while a third layer and a fourth layer that is different from the third layer are used in the second optical guide layer 29. The first through fourth layers are made of nitride semiconductors. Thus the multi-layer film structure having different values of band gap energy and refractive index may be formed by differing the ratio of Al between the first layer and the second layer and between the third layer and the fourth layer in each guide layer.

For example, in the structure where the first conductivity type layer, the active layer and the second conductivity type layer are stacked, such a structure is formed as the first optical guide layer has the first layer and the second layer and the second optical guide layer has the third layer and the fourth layer wherein the second layer and the third layer are located on the active layer side and the first layer and the fourth layer are located at positions far from the active layer, so that the band gap energy is decreased stepwise toward the active layer. Specifically, proportions $\beta 2$ and $\beta 3$ of Al in the second layer and the third layer that are located on the active layer side are made lower than proportions $\beta 1$ and $\beta 4$ of Al in the first layer and the fourth layer that are located away from the active layer side ($\beta 1 > \beta 2$, $\beta 4 > \beta 3$), that results in a stepped band structure enabling it to efficiently inject the carrier into the active layer formed in the waveguide with the active layer and the vicinity thereof having higher refractive index, thereby forming such a structure as light is distributed more around the active layer in the waveguide. The reason for making the optical guide layers in multi-layer structure is that higher ratio of Al leads to poor crystallinity and, in case it is difficult to form the optical guide layer in a single film because of deterioration in crystallinity or device characteristics, deterioration in crystallinity can be suppressed by forming in multi-layer film. Such a constitution is also possible as the proportions of Al are set to $\beta 1 < \beta 2$ and $\beta 4 < \beta 3$, not $\beta 1 > \beta 2$ and $\beta 4 > \beta 3$ described above, so that the guide layers (the second layer and the third layer) located near the active layer have a higher band gap energy and lower refractive index, while the guide layers (the first layer and the fourth layer) located away from the active layer have a lower band gap energy and higher refractive index. However, setting of $\beta 1 > \beta 2$ and $\beta 4 > \beta 3$ is preferred in order to achieve better carrier injection and light distribution. When forming the optical guide layers in multi-layer structure, each optical guide layer may also be constituted from three or more layers instead of the first through fourth layers described above, in such a way as the first layer (the third layer) and the second layer (the fourth layer) are stacked alternately, namely a plurality of pairs of the first layer and the second layer are stacked to constitute the guide layer. When forming the optical guide layers in multi-layer structure, mean composition of the entire optical guide layers is used in the calculation of the inequality $E_g-E_p \geqq 0.05$ eV. For example, when the first optical guide layer is formed from the first layer made of $Al_{\beta 1}Ga_{1-\beta 1}N$ ($0<\beta 1 \leqq 1$) having thickness of $d_1$ and $Al_{\beta 2}Ga_{1-\beta 2}N$ ($0<\beta 2 \leqq 1$, $\beta 1 \neq \beta 2$) having thickness of $d_2$, the mean proportion $\beta m$ of Al is given by weighting the proportion with thickness of each layer, namely $\beta m=(d_1 \times \beta 1+d_2 \times \beta 2)/(d_1+d_2)$.

Figure 8A:
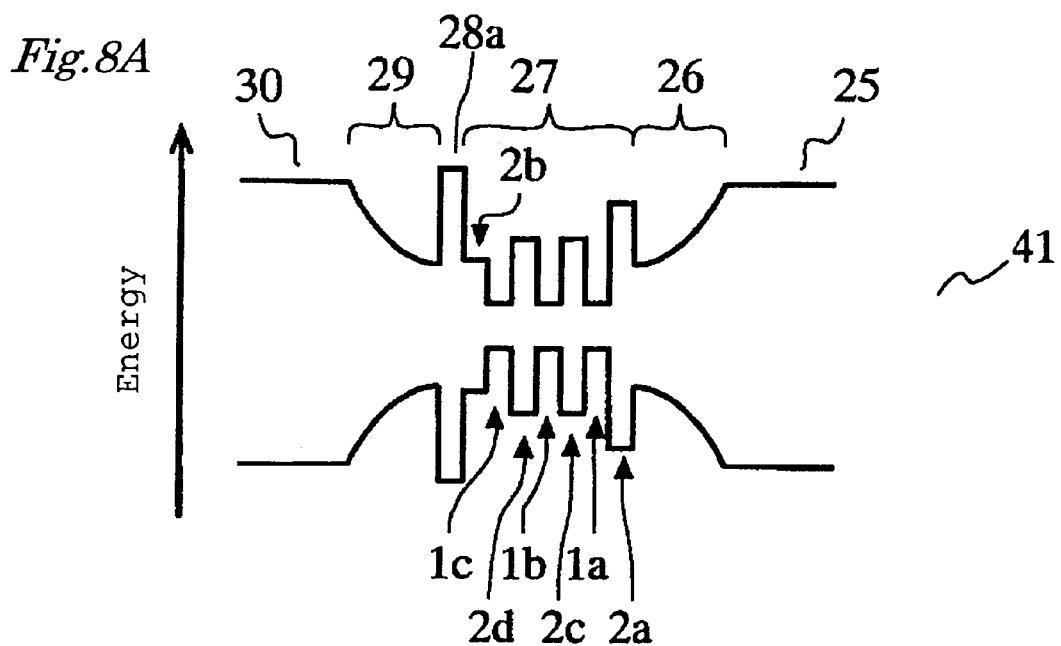
FIG. 8A is a schematic diagram showing the band structure 41 and FIGS. 8B to 8D are schematic diagrams showing the concentrations of impurities of different conductivity types according to one embodiment of the present invention.
Figure 8B:
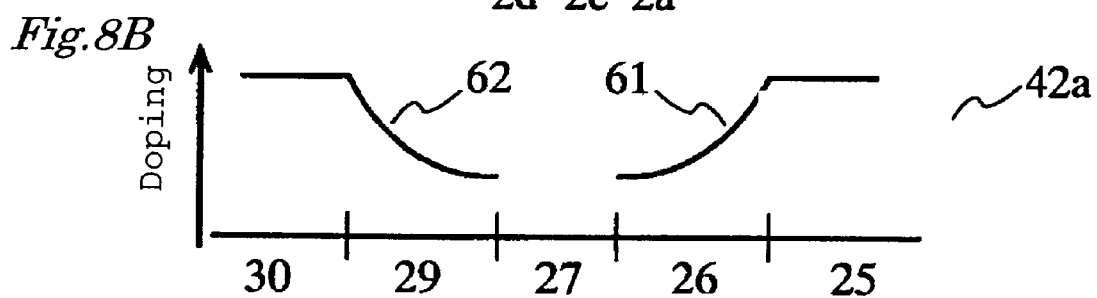
Figure 8C:
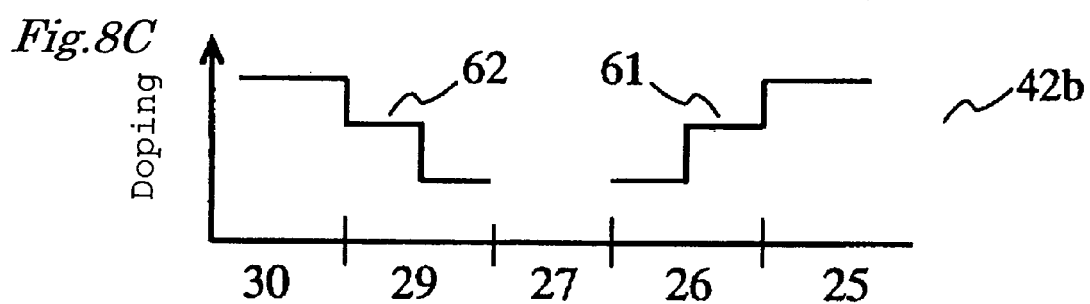
Figure 8D:
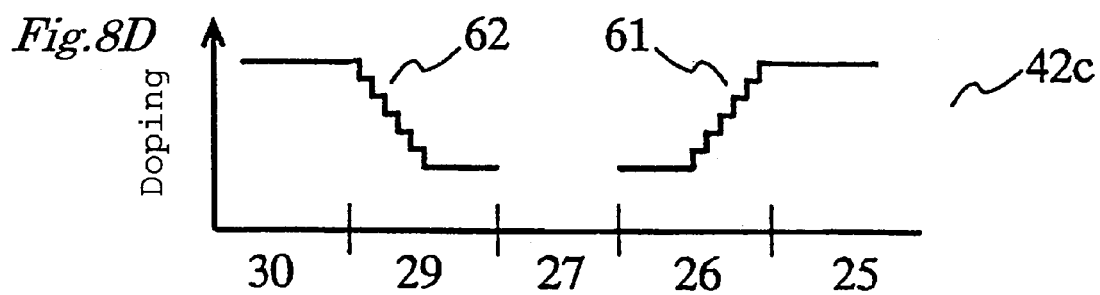

The optical guide layer of the present invention may be formed in GRIN(graded-index) structure having graded composition so that the band gap energy decreases as the distance from the active layer decreases. Specifically, GRIN structure can be formed and the efficiency of carrier injection can be improved by gradually changing the proportion $\beta$ of Al in such a way as the proportion $\beta$ of Al decreases as the distance from the active layer decreases. The graded composition may be realized either by changing the composition continuously as shown in FIG. 8A or changing the composition stepwise. Also as in the super lattice multi-layer film structure, such as the structure described above where a plurality of pairs of the first layer and the second layer are stacked alternately to constitute the first optical guide layer, the band gap energy may be caused to decrease as the distance from the active layer decreases by controlling the ratio of Al to change in graded distribution. In this case, only one of the layers, for example the first layer, may be formed in graded composition, or all layers constituting the pair, for example the first layer and the second layer, may be formed in graded composition. Graded composition may be partially provided in the direction of thickness of the optical guide layer, while it is preferable to provide graded composition in the direction of thickness of the entire region which enables it to improve the efficiency of carrier injection.

The optical guide layer of multi-layer film construction may also have super lattice structure. Use of super lattice structure makes it possible to suppress the deterioration of the crystallinity due to the nitride semiconductor including Al and form the waveguide with good crystallinity. Specifically, the first optical guide layer 26 is formed by stacking the first layer and the second layer alternately, two times or more for one of the layers, preferably two times or more for both layers, or the pair of the first layer and the second layer is stacked a plurality of times. While the composition of nitride semiconductor for each layer is the same as that described above, preferably the first layer and the second layer are made of $Al_{\beta 1}Ga_{1-\beta 1}N$ ($0 \leqq \beta 1 \leqq 1$) and $Al_{\beta 2}Ga_{1-\beta 2}N$ ($0 \leqq \beta 2 \leqq 1$, $\beta 1 \neq \beta 2$), respectively, or $Al_{\beta 1}Ga_{1-\beta 1}N$ ($0<\beta 1 \leqq 1$) and $Al_{\beta 2}Ga_{1-\beta 2}N$ ($0<\beta 2 \leqq 1$, $\beta 1 \neq \beta 2$), respectively, for the short wavelength region described above, which makes it possible to form the waveguide that suppresses the optical loss and the deterioration of crystallinity due to the super lattice structure. In order to form the optical guide layer in super lattice structure, each layer constituting the multi-layer film is set to such a thickness that allows it to form super lattice. While the thickness depends on the composition and the combination of the layers, thickness of 10 nm or less, preferably 7.5 nm or less is employed which ensures good crystallinity and more preferably 5 nm or less is employed to achieve better crystallinity.

The optical guide layer of the present invention is preferably doped with an impurity of each conductivity type at least in a part of the layer in order to achieve satisfactory movement and injection of the carrier. The optical guide layer may be doped partially or as a whole. In the optical guide layer of the multi-layer structure, in the first optical guide layer having the first layer and the second layer, both may be doped, or the first layer and the second layer may be doped in different concentrations, or modulated doping may be employed in which one layer is doped and the other is undoped. In such a super lattice multi-layer structure where the first layer and the second layer are stacked alternately in the first optical layer described above, or a plurality of pairs are provided, for example, deterioration of crystallinity can be suppressed by employing the modulated doping in which only one of the layers, for example the first layer, is doped. It is more preferable to dope only the layer that has lower Al content, which enables it to dope the layer of good crystallinity thereby suppressing the deterioration of crystallinity and achieving activation by doping with impurity. This is because, in the first optical guide layer having the super lattice structure comprising the first layer and the second layer that have compositions of $Al_{\beta 1}Ga_{1-\beta 1}N$ ($0 \leqq \beta 1 \leqq 1$) and $Al_{\beta 2}Ga_{1-\beta 2}N$ ($0 \leqq \beta 2 \leqq 1$, $\beta 1 < \beta 2$), respectively, by doping the second layer that has lower Al content and leaving the first layer undoped, crystallinity of the second layer that has lower Al content can be made better than that of the first layer and, consequently, doping the layer having better crystallinity with the impurity enables it to achieve higher activation and make the optical guide layer excellent in carrier movement and injection.

Doping of the optical guide layer with the impurity according to the present invention is such that, as indicated as the changing doping concentration in FIGS. 8A to 8D, in the first and second optical guide layers 26, 29, concentration of the doping impurity is decreased as the distance from the active layer decreases. When the concentration of the doping impurity is made lower in a region near the active layer than in a region far from the active layer, optical loss can be decreased further in the waveguide, particularly in the optical guide layer, thereby satisfactorily guiding the light while decreasing the threshold current density and drive current. This is because propagation of light through a region doped with impurity results in optical loss due to absorption of light by the impurity. In addition, the waveguide has such a structure as the active layer 27 is interposed by the first optical guide layer 26 and the second optical guide layer 29, while light is confined within the waveguide by such a structure as the outside of the guide layer or the waveguide is interposed by the upper and lower cladding layers 25, 30 that have refractive index lower than that of the guide layer. Much light is distributed in the active layer 27 provided in the waveguide and in the vicinity of the active layer. Therefore, by setting the concentration of doping impurity lower in the region near the active layer, namely by providing a low impurity concentration region in the active layer and a high impurity concentration region on the outside thereof (region away from the active layer), optical loss in the region where much light is distributed is decreased, thus making the waveguide subject to less optical loss. Specifically, in the first optical guide layer 26 and the second optical guide layer 29, consider a region near the active layer and a region away from the active layer, divided by a plane hat passes half point of each layer in thickness, and set the concentration of conductivity type impurity in the region near the active layer lower than that in the region away from the active layer, so that the region near the active layer become a low impurity concentration region and the region away from the active layer becomes a high impurity concentration region. There is no particular limitation to the impurity concentration in the optical guide layer, concentration in the region near the active layer is set to $5 \times 10^{17}/cm^3$ or less. Doping with impurity here means that the first optical guide layer is doped with the impurity of the first conductivity type and the second optical guide layer is doped with the impurity of the second conductivity type.

Mode of changing the doping concentration in the optical guide layer may be to decrease the doping concentration gradually and continuously toward the active layer in each optical guide layer (denoted by 42a), to decrease the doping concentration stepwise (denoted by 42b) or to reduce the step of the stepwise decreasing of the doping concentration so that the doping concentration is locally differentiated in the optical guide layer (denoted by 42c), or these mode may be combined. Preferably, in the optical guide layer, a region at distance of 50 nm or less from the active layer is left undoped (low impurity concentration region) which enables it to reduce the optical loss, and more preferably a region at distance of 100 nm or less from the active layer is left undoped (low impurity concentration region) which enables it to effectively reduce the optical loss, threshold current density and drive current. When the undoped region (low impurity concentration region) is the region at distance of 50 nm or less from the active layer, thickness of the optical guide layer is 50 nm or more and, when the region is 100 nm or less from the active layer, thickness of the optical guide layer is 100 nm or more, as a matter of course. When the undoped region is provided in the optical guide layer, it is combined with the optical guide layer of graded composition described above. This is because, as shown in FIG. 8A, the band gap energy decreases as the distance to active layer decreases, an optical guide layer having the efficiency of carrier injection prevented from decreasing is obtained even when the undoped region is provided in the vicinity of the active layer. AT this time, the optical guide layer of graded composition has a GRIN structure as described above. Then even when the band gap energy decreases as the distance to active layer decreases in the multi-layer structure described above, it is effective in forming the undoped region. In each optical guide layer, impurity may diffuse from the adjacent layers even when grown without doping, namely the optical guide layer is grown undoped, in which case the region grown without doping gets doped with the impurity. Specifically, Mg that is preferably used as the p-type impurity has high tendency of diffusion, and may diffuse from the adjacent electron confinement layer and the cladding layer thereby causing the layer to doped with the p-type impurity even when p-type optical guide layer is formed without doping, as shown in Example 1. In case doping with the impurity occurs due to diffusion, impurity concentration in the region near the active layer is made lower than in the far region, as described above. Such a doped region is preferably provided in at least one of the optical guide layers, and more preferably provided in both optical guide layers which makes the waveguide less subject to optical loss. Reference numerals 61, 62 in FIGS. 8B to 8D denote changes in the doping concentration in the optical guide layers.

The layer constitution, mode of doping with impurity, composition and thickness maybe the same or different between the first optical guide layer and the second optical guide layer. For example, both optical guide layers may be formed in different constitutions, with the first optical guide layer being a single film and the second optical guide layer multi-layer film.

(Cladding Layer)

In one embodiment of the present invention, the nitride semiconductor device may have such a structure as the first conductivity type layer, the active layer and the second conductivity type layer are stacked wherein the first conductivity type layer has a lower cladding layer and the second conductivity type layer has an upper cladding layer. Specifically, as shown in FIG. 2A, the first conductivity type layer 11, the active layer 12 and the second conductivity type layer 13 are stacked on a substrate, while the lower cladding layer 25 is provided in the first conductivity type layer and the upper cladding layer 30 is provided in the second conductivity type layer 13, the upper and lower cladding layers 25, 30 interposing the active layer. Such a constitution may also be employed as optical confinement is performed in the lower cladding layer 25 and the upper cladding layer 30, and the optical guide layer is provided in the waveguide that is interposed by the former two layers. Now the device structure having the cladding layers will be described below.

Compositions of the lower cladding layer 25 and the upper cladding layer 30 are, as shown in the band structure 41 in FIGS. 3B, 5A and 5B, such that the band gap energy is higher than that of the active layer (well layer), while in case the laser device, the end-face light emitting device has the first and second optical guide layers 26, 29, the band gap energy is set equal to that of the optical guide layer or higher, so that the refractive index is lower than that of the optical guide layer. This is for the purpose of having the upper and lower cladding layers function as carrier confinement layer and optical confinement layer. When provided with an optical guide layer, it is made function as an optical confinement layer. The cladding layer is formed preferably from nitride semiconductor including Al, specifically nitride semiconductor $In_aAl_bGa_{1-a-b}N$ ($0 \leq a$, $0<b$, $a+b \leq 1$). Preferably, a nitride semiconductor having the proportion a of In content being zero is used, because nitride semiconductor including In tends to cause optical loss due to the absorption of light in the cladding layer. Accordingly, a nitride semiconductor having composition of $Al_bGa_{1-b}N$ ($0<b \leq 1$) is preferably used so as to achieve satisfactory optical confinement and, when the guide layer is not provided, satisfactory carrier confinement. In the laser device, the end-face light emitting device having such a structure as the waveguide is interposed between the upper and lower cladding layers, sufficient difference is provided in the refractive index between the waveguide and the cladding layer, specifically between the active layer and/or the optical guide layer, so that light is confined in he waveguide and light is guided therein. Such a difference in refractive index is provided preferably by using $Al_bGa_{1-b}N$ ($0<b \leq 1$), and a sufficient difference in the refractive index can be obtained by satisfying a relation $\beta \leq b$ with the Al content (mean proportion) $\beta$ in the optical guide layer, preferably satisfying $b-\beta \geq 0.05$. Since optical confinement by the cladding layer depends only on the thickness of the cladding layer, composition of the nitride semiconductor is determined while paying consideration also to the thickness. In the Examples of the present invention, sufficient difference in the refractive index from the optical guide layer for the optical confinement can be provided and the cladding layer can be formed with sufficient thickness, since the Al mixed crystal ratio (mean composition) in the cladding layers is made lower than that of the first barrier layer as shown in FIG. 2B. That is, by forming the cladding layer having a desired difference in refractive index from the optical guide layer that has lower Al mixed crystal ratio than that of the active layer, particularly the first barrier layer, it is made possible to lower the Al mixed crystal ratio in the cladding layer. Moreover in the Example, since the optical guide layer having lower that the second barrier layer is formed, the Al mixed crystal ratio in the cladding layer is suppressed as low as possible, so that the nitride semiconductor operating at short wavelengths with excellent device characteristics can be obtained.

The cladding layer of the present invention may be formed in a single film, a multi-layer film or a multi-layer super lattice structure similarly to the optical guide layer described above. When the cladding layer is formed in a single film, forming the single-film from the nitride semiconductor described above makes it easier to design the carrier confinement structure and reduce the time required for growing the cladding layer, compared to the case of forming a multi-layer film. On the other hand, it is difficult to grow a nitride semiconductor including Al such as AlGaN with good crystalinity, and cracks are more likely to occur when the film is grown thicker than a certain level.

When the cladding layer is formed in a multi-layer film, a plurality of nitride semiconductor layers of different compositions are stacked. Specifically, a plurality of nitride semiconductor layers of different proportions of Al content are stacked. By forming such a multi-layer film, it is made possible to suppress the deterioration of crystalinity and occurrence of cracks suffered in the case of single film. The multi-layer film is formed specifically by stacking a first layer and a second layer having a composition different from that of the first layer, thereby forming a plurality of layers that have different values of refractive index and band gap energy. For example, the multi-layer film may be formed by stacking the first layer having proportion b1 of Al content and the second layer having proportion b2 of Al content (b1≠b2). At this time, when the proportions of Al content are set to b1<b2 (0≦b1, b2≦1), high refractive index and high band gap energy can be achieved by the first layer that has high Al content and deterioration of crystallinity due to the formation of the first layer can be suppressed by means of the second layer having lower Al content. Also more layers having different compositions may be stacked such as stacking the first layer and the second layer and then stacking a third layer that has different composition from the second layer. The first layer and the second layer may also be stacked alternately. A plurality of pairs of at least the first layer and the second layer may also be formed. Such a multi-layer structure enables it to achieve film thickness required for optical confinement, since deterioration in crystallinity due to the nitride semiconductor including Al can be suppressed and the thickness can be increased.

In the cladding layer of multi-layer structure, it is preferable to form in the super lattice structure which enables it to form the cladding layer with better crystallinity. The super lattice structure is formed at least in part of the cladding layer, and preferably in the entire cladding layer which enables it to form the cladding layer with better crystallinity. At this time, similarly to the case of the optical guide layer, the super lattice structure by stacking plurality of pairs of at least the first layer and the second layer, or stacking a plurality of pairs of at least the first layer and the second layer. While the thickness of each layer constituting the super lattice structure depends on the composition and the combination of the layers, thickness of 10 nm or less, preferably 7.5 nm or less is employed which ensures good crystallinity and more preferably 5 nm or less is employed to achieve better crystallinity.

The cladding layer is preferably doped with an impurity of each conductivity type and, similarly to the optical guide layer, may be doped partially or as a whole. In the case of the multi-layer structure, similarly to the optical guide layer, the first layer and the second layer, both may be doped, or the first layer and the second layer may be doped in different concentrations, or modulated doping maybe employed in which one layer is doped and the other is undoped. For example, in the super lattice structure comprising the first layer and the second layer that have compositions of $Al_{b1}Ga_{1-b1}N$ ($0\leq b1 \leq 1$) and $Al_{b2}Ga_{1-b2}N$ ($0 < b2 \leq 1$, b1<b2), respectively, by doping the second layer that has lower Al content and leaving the first layer undoped, crystallinity can be improved similarly to the optical guide layer.

While there is no limitation to the thickness of the cladding layer, the thickness is in a range from 10 nm to 2 μm, preferably from 50 nm to 1 μm. This is because confinement of carrier becomes possible when the thickness is 10 nm or more, deterioration of crystallinity can be suppressed by setting the thickness within 2 μm. Also confinement of carrier and application to the laser device and end-face light emitting device become possible when the thickness is 50 nm or more, and the cladding layer can be formed with good crystallinity by setting the thickness within 1 μm.

The upper cladding layer and the lower cladding layer are preferably made of nitride semiconductor including Al operating at short wavelengths, which enables it to ensure a large difference in refractive index between the waveguide and the cladding layers. It is preferable that the nitride semiconductor to form the cladding layers does not include In, because nitride semiconductor including In leads to low crystallinity. In a structure having a p-side cladding layer on the active layer, in particular, use of nitride semiconductor including In in the p-side cladding layer causes significant deterioration of crystallinity, resulting in significant deterioration of the device characteristics. The nitride semiconductor used for the cladding layer is preferably $Al_bGa_{1-b}N$ (0<b<1).

(Carrier Confinement Layer <p-side Electron Confinement Layer>)

According to the present invention, as indicated by the band structure 41 in FIGS. 3A, 5A and 5B, it is preferable to provide the carrier confinement layer 28 in the active layer 27 or near the active layer, in the combination with the asymmetrical structure of the first and second barrier layers in the active layer. In the case of a structure that has the optical guide layers 26, 29 and the cladding layers 25, 30 as in the case of the laser device and the end-face light emitting device, the carrier confinement layer is preferably provided between the optical guide layers 26, 29 and the active layer 27, or as a part of the active layer of the optical guide layer, as shown in FIGS. 2A, 3A, 5A and 5B. The carrier confinement layer confines the carrier in the active layer or in the well layer, and makes it possible to prevent the carrier from overflowing the active layer by increasing temperature by driving of the device and increasing current density in the laser device or light emitting device of high output power. Thus such a structure as the carrier can be injected into the active layer is obtained. Specifically, as shown in FIGS. 3A, 5A and 5B, the carrier from the first conductivity type layer is confined by the carrier confinement layer 28b that is located on the second conductivity type layer side and the carrier from the second conductivity type layer is confined by the carrier confinement layer 28a that is located on the first conductivity type layer side. The carrier confinement layer is preferably provided at least one side and, in such a device as the first conductivity type layer is made n-type and the second conductivity type layer is set p-type as sown in Example 1, the carrier confinement layer is preferably provided at least on the p-type layer side. This is because diffusion length of electron is longer than the diffusion length of hole in the nitride semiconductor, electron is more likely to overflow the active layer, and therefore the laser device or light emitting device of high output power can be obtained by providing the carrier confinement layer 28 that confines electron on the p-type layer side. Now a device that combines the second barrier layer having a low band gap energy will be described below in the Example where the carrier confinement layer is provided as the p-side electron confinement layer on the p-type layer side, that can be applied also to n-type layer by changing the conductivity type. It is particularly preferable to provide at least the p-side electron confinement layer. This is because diffusion length of electron is longer than the diffusion length of hole, and electron is more likely to overflow the active layer The p-side electron confinement layer is made of nitride semiconductor including Al, specifically $Al_cGa_{1-c}N$ (0<c<1). At this time, it is necessary to ensure a band gap energy sufficiently higher than that of the active layer (offset therefrom) for the carrier confinement layer to function. Proportion c of Al content is set in a range of $0.1 \leq c<1$, and preferably in a range of $0.2 \leq c<0.5$. This is because the electron confinement layer cannot fully function when c is 0.1 or less, while electron can be fully confined (carrier can be confined) and carrier can be restricted from overflowing when c is 0.2 or more. When c is 0.5 or lower, crystal can be grown while suppressing the occurrence of cracks and, when c is 0.35 or lower, crystal can be grown with good crystallinity. When the structure has the optical guide layer described above, it is preferable that the carrier confinement layer has a band gap energy equal to or higher than that of the cladding layer. This is because confinement of carrier requires nitride semiconductor having higher mix proportion than that of the cladding layer that confines light. The p-side electron confinement layer can be used in the nitride semiconductor device of the present invention and, particularly in a device that is driven with a large current where much carrier is injected into the active layer such as laser device, enables it to more effectively confine the carrier than in the case where the p-side electron confinement layer is not provided, thereby making application possible not only to the laser device but also to LED of high output power. At this time excellent device characteristics can be achieved by providing the carrier confinement layer having a band gap energy higher than that of the first barrier layer in the asymmetrical structure of the active layer.

Thickness of the carrier confinement layer of the present invention is set within 100 nm, and preferably within 40 nm. This is because nitride semiconductor including Al has higher bulk resistance than other nitride semiconductors (that do not include Al), while the Al mixed crystal ratio in the p-side electron confinement layer is set to a high value as described above, and therefore thickness beyond 100 nm results in extremely high resistance which leads to a significant increase in the forward voltage Vf. When the thickness is 40 nm or less, the increase in Vf can be suppressed and more preferably when the thickness is 20 nm or less, the increase in Vf can be suppressed further. The lower limit of the thickness of the p-side electron confinement layer is set to 1 nm or more, preferably 5 nm or more which enables it to satisfactorily confine electrons. The carrier confinement layer may be formed in a single-film or a multi-layer film of different compositions.

In the nitride semiconductor device of the present invention, when only the cladding layer is provided without providing the optical guide layer, if a band offset that is enough to confine the carrier between the active layer and the cladding layer, it is not necessary to provide the carrier confinement layer apart from the cladding layer but, in case the cladding layer is located apart from the active layer as in the structure having the optical guide layer, it is better to provide the carrier confinement layer between the active layer and the cladding layer, and preferably in the vicinity of the active layer. This is because the effect of suppressing the carrier overflow is lost when the carrier confinement layer is provided at a position away from the active layer. Specifically the distance between the active layer and the p-side electron confinement layer (carrier confinement layer) is set to 100 nm or less which enables effective carrier confinement function, and is more preferably to 500 Å or less which enables better carrier confinement function. When the carrier confinement layer is located on the outside of the active layer, preferably it is provided in contact with the active layer which enables most efficient confinement of the carrier in the active layer. When the carrier confinement layer is provided in the active layer in this way, the band gap energy is made higher than that of the barrier layer provided in the active layer, particularly the first barrier layer, and more preferably the band gap energy is made higher than that of all the barrier layers provided in the active layer which makes the carrier confinement layer outside the active layer suitable for the symmetrical structure of the active layer described above.

The p-side electron confinement layer (carrier confinement layer) according to the present invention may be grown undoped or doped with p-type impurity (impurity of each conductivity type), and is preferably doped with impurity of the designated conductivity type, for example, the p-side electron confinement layer is doped with p-type impurity, for the purpose of increasing the mobility of the carrier and decrease Vf. In the case of a laser device or high-power LED that is driven with a large current, it is preferable to dope in a high concentration in order to improve the mobility. Doping concentration is controlled to $5 \times 10^{16}/cm^3$ or higher and preferably $5 \times 10^{18}/cm^3$ or higher. In the device that is driven with a large current described above, concentration is controlled to $1 \times 10^{18}/cm^3$ or preferably $1 \times 10^{19}/cm^3$ or higher. While the upper limit of the concentration of p-type impurity is not specified, the concentration is kept within $1 \times 10^{21}/cm^3$. When too much p-type impurity is included, bulk resistance increases that leads to higher value of Vf. In order to avoid this problem, minimum possible concentration of p-type impurity that can ensure the required level of carrier mobility is employed. It is also possible to form an undoped carrier confinement layer and then dope the layer with the impurity that diffuses from the adjacent layers.

According to the present invention, the p-side carrier confinement layer doped with the p-type impurity that is located outside of the active layer, particularly on the p-type layer side is used, so that a p-n junction is formed near the carrier confinement layer that is located near the active layer as shown in FIGS. 3B and 5B when voltage is applied. This makes it possible to achieve efficient injection of the carrier into the well layer by the second barrier layer having small offset, without providing the offset that impedes the injection of the carrier from the p-type layer side.

EXAMPLE 1

Now a laser device made of the nitride semiconductor device having the laser device structure as shown in FIG. 1 will be described below as the Example.

(Substrate 101)

For the substrate, a nitride semiconductor, GaN in this Example, is grown into a thick film (100 μm) on a substrate made of a different material. With the substrate of the different material being removed, a nitride semiconductor substrate made of GaN with a thickness of 80 μm is used. Detailed process of forming the substrate is as follows. A substrate of different material made of sapphire with the principal plane lying in the C plane having diameter of 2 inches is set in an MOVPE reaction vessel, of which temperature is set to 500° C., and a buffer layer made of GaN is formed to a thickness of 200 Å by using trimethyl gallium (TMG) and ammonia ($NH_3$). With the temperature raised, a film of undoped GaN with thickness of 1.5 μm is grown as a base layer. Then with a plurality of striped masks formed on the base layer surface, a nitride semiconductor, GaN in this Example, is selectively grown through apertures (windows) of the mask. The nitride semiconductor layer formed by a growing process involving lateral growth (ELOG) is further grown to become thicker. Then the nitride semiconductor substrate is obtained by removing the substrate of different material, the buffer layer and the base layer. At this time, the mask used in the selective growth is made of $SiO_2$ having mask thickness of 0.1 μm, mask width of 20 μm and aperture (opening) width of 8 μm, with orientation of GaN (1–100) direction.

(Buffer Layer 102)

On the GaN substrate, at a temperature of 1,050° C., formed is a buffer layer 102 made of $Al_{0.05}Ga_{0.95}N$ to a thickness of 4 μm by using TMG (trimethyl gallium), TMA (trimethyl aluminum) and ammonia. This layer functions as a buffer layer between the n-side contact layer made of AlGaN and the nitride semiconductor substrate made of GaN. Then layers which constitute the device structure are formed on the base layer made of nitride semiconductor.

(N-side Contact Layer 103)

The n-side contact layer 103 made of $Al_{0.05}Ga_{0.95}N$ doped with Si is formed to a thickness of 5 μm at a temperature of 1,050° C. on the buffer layer 102, which has been formed as described above, by using TMG, TMA, ammonia, and silane gas used as an impurity gas.

(Crack Preventing Layer 104)

Then a crack preventing layer 104 made of $In_{0.06}Ga_{0.94}N$ is formed to a thickness of 0.15 μm at a temperature of 800° C. by using TMG, TMI (trimethyl indium), ammonia and silane gas used as an impurity gas.

(N-side Cladding Layer 105: Lower Cladding Layer 25)

Then with the temperature being set to 1,050° C., after growing a layer A made of undoped $Al_{0.05}Ga_{0.95}N$ to a thickness of 25 Å by using TMA, TMG and ammonia as the stock material gas, supply of impurity gas is stopped and a layer B made of undoped $Al_{0.1}Ga_{0.9}N$ is formed to a thickness of 25 Å. This operation is repeated 100 times to stack the layer A and the layer B thereby to form the n-side cladding layer 106 made in multi-layered film (super lattice structure) having a thickness of 0.5 μm. At this time, a difference in the refractive index which is sufficient for the cladding layer to function can be provided when the ratio of Al of the undoped AlGaN is in a range from 0.05 to 0.3. At this time, mean mix ratio of Al in the n-side cladding layer 25 is 0.75 that is lower than that of the first barrier layer 2a, higher than those of the second barrier layer 2b and the optical guide layer 26, as shown in FIG. 2B. Similarly, the band gap energy of the n-side cladding layer 25 is lower than that of the first barrier layer 2a, higher than those of the second barrier layer 2b and the optical guide layer 26. Concentration of the n-type impurity is higher in the n-side cladding layer 25 and the first barrier layer 2a than in the optical guide layer.

(N-side Optical Guide Layer 106: Lower Optical Guide Layer 26)

Then at a similar temperature, an optical guide layer 106 made of undoped $Al_{0.05}Ga_{0.95}N$ is formed to a thickness of 0.15 μm by using TMA, TMG and ammonia as the stock material gas. This layer may also be doped with an n-type impurity. This layer becomes the first semiconductor layer in the present invention. The n-side optical guide layer, the active layer, the carrier confinement layer and the p-side optical guide layer in this Example correspond to the lower optical guide layer (first semiconductor layer) 26, the active layer 27, the carrier confinement layer 28 and the upper optical guide layer (second semiconductor layer) 29 shown in FIG. 3A, respectively.

(Active Layer 107 (27, 12))

Then at a similar temperature, a barrier layer (the first barrier layer 2a) made of $Al_{0.15}Ga_{0.85}N$ doped with Si in a concentration of $5\times10^{18}/cm^3$ is formed to a thickness of 100 Å by using TMA, TMG and ammonia as the stock material gas and silane gas as the impurity gas. Then the supply of TMA and silane gas is stopped and a well layer 1a (W) made of GaN is formed to a thickness of 100 Å, while stacking the layers in the order of (B)/(W)/(B) using undoped $Al_{0.05}Ga_{0.95}N$ of thickness 150 Å as the last barrier layer (the second barrier layer 2b). The active layer 107 may be made in multiple quantum well structure (MQW) by repeating the stacking of the barrier layer (B) and the well layer (W) in the form of (B)/(W)/(B). The well layer 1a has lower concentration of n-type impurity than that the first barrier layer 2a, while the second barrier layer 2b has lower concentration of n-type impurity than that the first barrier layer 2a, and a higher band gap energy, higher Al mixed crystal ratio and larger thickness.

(P-side Electron Confinement Layer 108: Carrier Confinement Layer 28)

Then at a similar temperature, a p-side electron confinement layer 108 made of $Al_{0.3}Ga_{0.7}N$ doped with Mg in a concentration of $1\times10^{19}/cm^3$ is formed to a thickness of 100 Å by using TMA, TMG and ammonia as the stock material gas and $Cp_2Mg$ (cyclopentadienyl magnesium) as the impurity gas. This layer may not be provided, though this would function as an electron confinement layer and help decrease the threshold when provided.

(P-side Optical Guide Layer 109: Upper Optical Guide Layer 29)

Then by setting the temperature to 1,050° C., a p-side optical guide layer 109 made of undoped $Al_{0.05}Ga_{0.95}N$ is formed to a thickness of 0.15 μm by using TMG and ammonia as the stock material gas. Although the p-side optical guide layer 109 is grown undoped, Mg concentration therein reaches $5\times10^{16}/cm^3$ so as to be p-type due to the diffusion of Mg from adjacent layers such as p-side electron confinement layer 108 and p-side cladding layer 110. This layer may also be grown while intentionally doping. This layer makes the second semiconductor layer.

(P-side Cladding Layer 110: Upper Cladding Layer 30)

Then with the supply of TMA stopped and using $Cp_2Mg$, a layer made of $Al_{0.05}Ga_{0.95}N$ doped with Mg is formed to a thickness of 25 Å at 1,050° C., then supply of $Cp_2Mg$ is stopped and a layer of undoped $Al_{0.1}Ga_{0.9}N$ is formed to a thickness of 25 Å. This operation is repeated 100 times to form the p-side cladding layer 110 constituted from super lattice structure of total thickness of 0.5 μm. When the p-side cladding layer is formed in super lattice structure consisting of nitride semiconductor layers of different band gap energy levels with at least one nitride semiconductor layer including Al being stacked one on another, crystallinity tends to be improved by doping one of the layers more heavily than the other, in the so-called modulated doping. In the present invention, however, both layers may be doped similarly. Forming the p-side cladding layer 110 in super lattice structure enables it to increase the Al mixed crystal ratio of the entire cladding layer, resulting in lower refractive index of the cladding layer and a higher band gap energy, which are effective in decreasing the threshold. Moreover, the super lattice structure makes the probability of pits and short circuiting to be generated in the cladding layer lower than otherwise. Mean Al mixed crystal ratio at this time is 0.75, similarly to the n-side cladding layer and, as shown in FIG. 2B, the Al mixed crystal ratio of the p-side cladding layer 30 is lower than that of the first barrier layer 2a, higher than those of the second barrier layer 2b and the optical guide layer 29. With regard to the band gap energy, too, the p-side cladding layer 30 has a band gap energy lower than the first barrier layer 2a, higher than those of the second barrier layer 2b and the optical guide layer 29. Concentration of the p-side impurity is higher in the carrier confinement layer 28 than in the p-side cladding layer 30, and higher in the p-side cladding layer 30 than in the optical guide layer 29, so that the second barrier layer 2b and the optical guide layer 29 is doped in a low concentration by the diffusion of impurity from the carrier confinement layer 28 or remain undoped.

(P-side Contact Layer 111)

Last, at a temperature of 1,050° C., a p-side contact layer 111 made of p-type GaN doped with Mg in a concentration of $1\times10^{20}/cm^3$ is formed to a thickness of 150 Å on the p-side cladding layer 110. The p-side contact layer 111 may be formed from p-type $In_xAl_yGa_{1-x-y}N$ ($0 \leq X$, $0 \leq Y$, $X+Y \leq 1$), and preferably from Mg-doped GaN which achieves the best ohmic contact with the p-side electrode 120. Since the contact layer 111 is the layer where the electrode is to be formed, it is desirable to have a high carrier concentration of $1\times10^{17}/cm^3$ or higher. When the concentration is lower than $1\times10^{17}/cm^3$, it becomes difficult to achieve satisfactory ohmic contact with the electrode. Forming the contact layer in a composition of GaN makes it easier to achieve satisfactory ohmic contact with the electrode. After the reaction has finished, the wafer is annealed in nitrogen atmosphere at 700° C. in the reaction vessel thereby to further decrease the electrical resistance of the p-type layer. The device made by stacking the layers as described above has the stacking structure shown in FIG. 2A and the Al mixed crystal ratio shown in FIG. 2B. Specifically, the n-side cladding layer 26 and the p-side cladding layer that have Al mixed crystal ratio lower than that of the first barrier layer 2a and higher than that of the well layer 1a sandwich the active layer and the optical guide layers 26, 29. The n-side optical guide layer 26 and the p-side optical guide layer 29 are made of nitride semiconductor that has Al mixed crystal ratio lower than that of the first barrier layer 2a and higher than that of the well layer 1a. The cladding layers 25, 30 are made of nitride semiconductor that has Al mixed crystal ratio higher than that of the optical guide layers 26, 29 and lower than that of the second barrier layer 2b.

After forming the nitride semiconductor layers one on another as described above, the wafer is taken out of the reaction vessel. Then a protective film of $SiO_2$ is formed on the surface of the top-most p-side contact layer, and the surface of the n-side contact layer 103 whereon the n-side electrode is to be formed is exposed as shown in FIG. 1 by etching with $SiCl_4$ gas in the RIE (reactive ion etching) process. For the purpose of deep etching of the nitride semiconductor, $SiO_2$ is best suited as the protective film.

Then ridge stripe is formed as the striped waveguide region described above. First, a first protective film 161 having thickness of 0.5 μm is formed from Si oxide (mainly $SiO_2$) over substantially the entire surface of the top-most p-side contact layer (upper contact layer) by means of a PDV apparatus. Then the first protective film 161 is patterned with stripe width of 1.6 μm with a mask of a predetermined configuration being placed thereon by means of photolithography process and the RIE (reactive ion etching) apparatus which employs $CF_4$ gas. At this time, height of the ridge stripe (depth of etching) is set so that thickness of the p-side optical guide layer 109 becomes 0.1 μm by partially etching the p-side contact layer 111, the p-side cladding layer 109 and the p-side optical guide layer 110.

After forming the ridge stripe, a second protective layer 162 made of Zr oxide (mainly $ZrO_2$) is formed on the first protective layer 161 to a thickness of 0.5 μm continuously over the first protective layer 161 and the p-side optical guide layer 109 which has been exposed by etching.

After forming the second protective film 162, the wafer is subjected to heat treatment at 600° C. When the second protective film is formed from a material other than $SiO_2$, it is preferable to apply heat treatment at a temperature not lower than 300° C., preferably 400° C. or higher but below the decomposition temperature of the nitride semiconductor (1,200° C.) after forming the second protective film. Since the heat treatment makes the second protective film less soluble to the material (hydrofluoric acid) that dissolves the first protective film, thus it is desirable to add this process.

Then the wafer is dipped in hydrofluoric acid to remove the first protective film 161 by the lift-off process. Thus the first protective film 161 provided on the p-side contact layer 111 is removed thereby to expose the p-side contact layer. The second protective film 162 is formed on the side faces of the ridge stripe and the plane which continues therefrom (exposed surface of the p-side optical guide layer 109) as shown in FIG. 1.

After the first protective film 161 provided on the p-side contact layer 112 is removed as described above, a p-side electrode 120 made of Ni/Au is formed on the surface of the exposed p-side contact layer 111 as shown in FIG. 1. The p-side electrode 120 is formed with stripe width of 100 μm over the second protective film 162 as shown in FIG. 1. After forming the second protective film 162, an n-side electrode 121 made of Ti/Al in stripe configuration is formed in a direction parallel to the stripe on the n-side contact layer 103 which has been already exposed.

Then the surface of a desired region which has been exposed by etching where lead-out electrodes for the p-side and n-side electrodes are to be formed is masked, and a multi-layered dielectric film 164 made of $SiO_2$ and $ZrO_2$ is formed. Lead-out (pad) electrodes 122, 123 made of Ni—Ti—Au (1,000 Å–1,000 Å–8,000 Å) are formed on the p-side and n-side electrodes. At this time, the active layer 107 is formed with a width of 200 μm (width in the direction perpendicular to the resonator direction). The multi-layered dielectric film made of $SiO_2$ and $ZriO_2$ are formed also on the resonator surface (reflector side).

After forming the n-side and p-side electrodes as described above, the wafer is divided into bar shape along M plane (M plane of GaN, (11-00) or the like) of the nitride semiconductor in the direction perpendicular to the striped electrode. The wafer of bar shape is further divided to obtain laser devices with the resonator length being 600 Å m.

A laser device capable of continuous oscillation at a wavelength of 369 nm threshold current Ith of 61 mA and current density of 3.8 kA/cm² at the room temperature can be made. The laser device thus obtained has estimated lifetime of about 4,000 hours under the condition of continuous oscillation at room temperature.

EXAMPLE 2

A laser device is obtained similarly to Example 1 except for forming the active layer as follows.

(Active Layer 107 (27, 12))

The active layer has a single quantum well structure where the first barrier layer 2a formed from Si-doped $Al_{0.15}Ga_{0.85}N$ to a thickness of 150 Å, the well layer 1b formed from undoped GaN to a thickness of 100 Å and the second barrier layer 2b formed from undoped $Al_uGa_{1-u}N$ to a thickness of d (Å) stacked successively.

Figure 9:
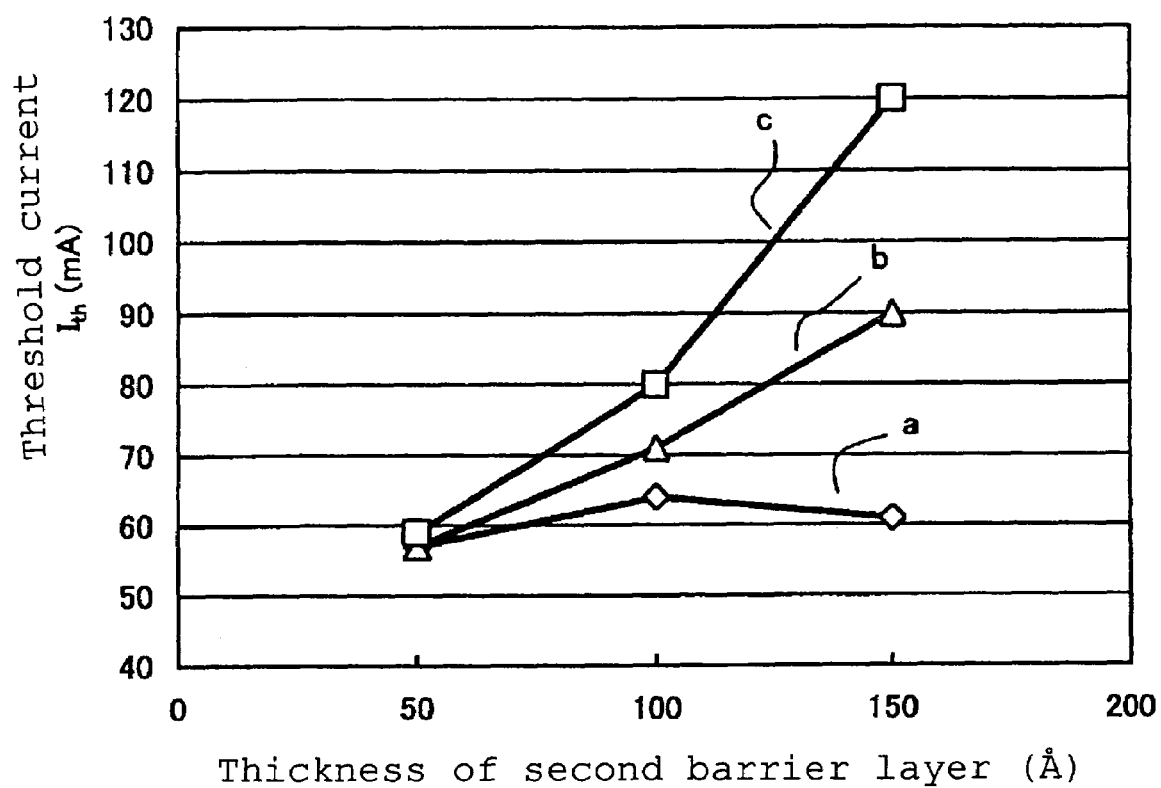
FIG. 9 is a schematic diagram showing the variation in threshold current $I_{th}$ as the Al composition ratio and thickness of second barrier layer change in the laser device according to one embodiment of the present invention.
Figure 10:
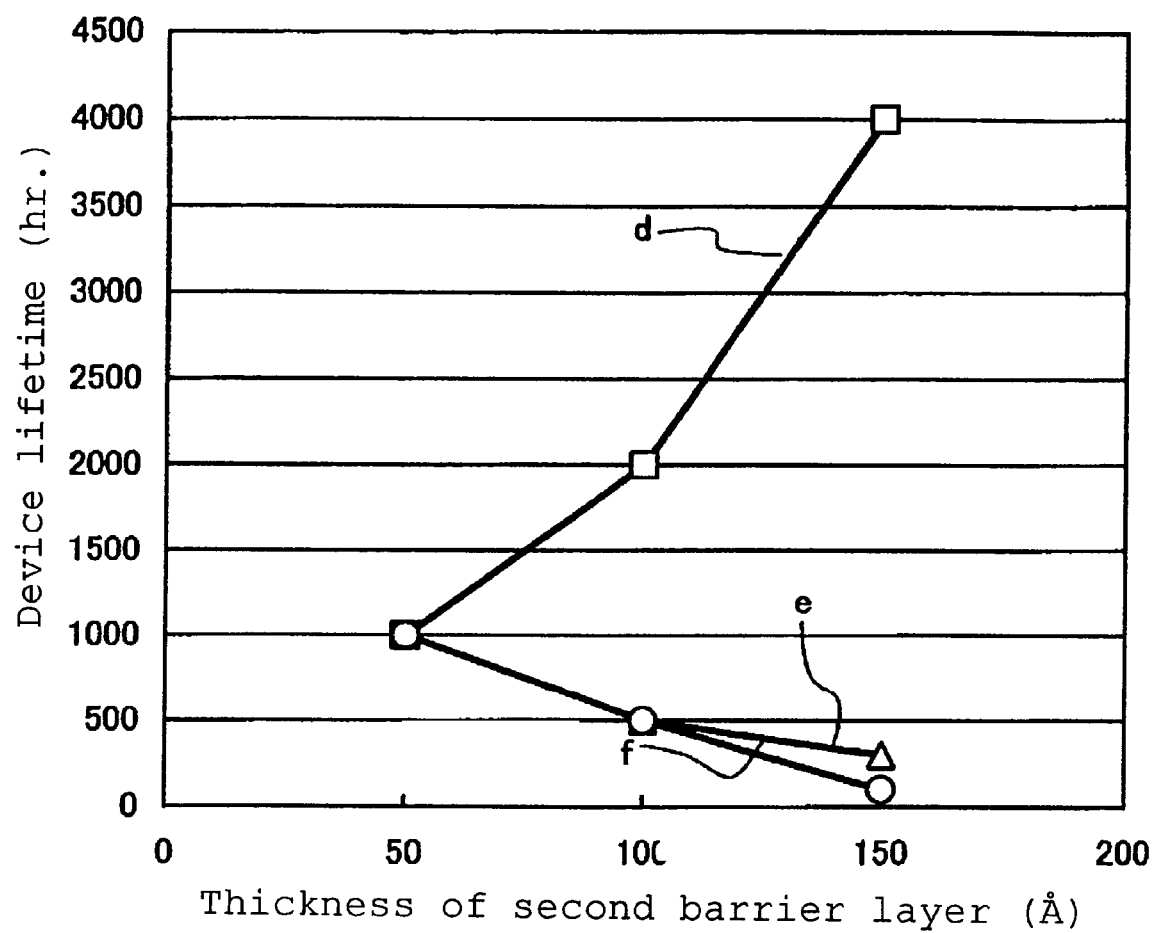
FIG. 10 is a schematic diagram showing the variation in device lifetime as the ratio of Al and thickness of second barrier layer change in the laser device according to one embodiment of the present invention.

With the Al mixed crystal ratio u of the second barrier layer being set to 0.05 (the same Al mixed crystal ratio as in Example 1), 0.1 and 0.15 (Comparative Examples), the threshold current and device lifetime are shown in FIG. 9 and FIG. 10, respectively, as functions of the thickness of the second barrier layer. Changes in the threshold current with the changing thickness of the second barrier layer are shown in FIG. 9 with graph (a) when the Al mixed crystal ratio u of the second barrier layer is u=0.05, graph(b) when u=0.1 and graph(c) when u=0.15 (Comparative Example). Changes in the device lifetime with the changing thickness of the second barrier layer are shown in FIG. 10 with graph (d) when the Al mixed crystal ratio u of the second barrier layer is u=0.05, graph(e) when u=0.1 and graph(f) when u=0.15 (Comparative Example). Device characteristics are estimated by changing the thickness d from 50 Å, 100 Å to 150 Å.

As will be seen from FIG. 9, a laser device is obtained that experiences substantially no change in the threshold current $I_{th}$ when the thickness is changed to 50 Å or 100 Å in addition to 150 Å that is the same as in Example 1, when the Al mixed crystal ratio u of the second barrier layer is u=0.05 (same as in Example 1). When the Al mixed crystal ratio u of the second barrier layer is u=0.05 (same as in Example 1) as shown in FIG. 10, the device lifetime varied substantially as the thickness is changed in addition to 150 Å that is the same as in Example 1. When the thickness is 100 Å, almost the same as the first barrier layer, the lifetime decreases to about a half and, when the thickness is 50 Å, less than that of the first barrier layer, the lifetime further decreases to a half of the former. Thus it can be assumed that, when the Al mixed crystal ratio u of the second barrier layer is lower than that of the first barrier layer as shown in Example 1, threshold current does not show substantial variation with the changing thickness of the second barrier layer, although the device lifetime shows drastic improvement when thickness of the second barrier layer is made larger than that of the first barrier layer, compared to the cases of same or smaller thickness as the first barrier layer.

When the Al mixed crystal ratio u of the second barrier layer is u=0.1, unlike in the case of u=0.05, the threshold current $I_{th}$ increases as the thickness d increases as indicated by graph(b) in FIG. 9 and the device lifetime decreases as the thickness d increases as indicated by graph(e) in FIG. 10. This supposedly because the offset increases, particularly the offset with respect to the second semiconductor layer increases, the as the Al mixed crystal ratio becomes higher, unlike in the case of u=0.05, the efficiency of carrier injection from the second conductivity type layer decreases. That is, as the second barrier layer 2b is formed from a nitride semiconductor that has Al mixed crystal ratio higher than the second semiconductor layer (p-side optical guide layer) with a higher band gap energy than the second semiconductor layer, larger offset is generated thereby causing the threshold current to increase in comparison to a case of similar level of Al mixed crystal ratio and band gap energy as those of the second barrier layer of u=0.05 and the second semiconductor layer as shown in FIG. 3B. Also because the well layer is formed from GaN, when the second barrier layer is formed from nitride semiconductor including Al, the difference in thermal expansion coefficient causes a strong stress to be applied the Al mixed crystal ratio u increases to u=0.1, significant adverse effect of the deteriorating crystallinity affect the increasing threshold and the decreasing device lifetime. Particularly since the threshold increases as the thickness increases, the effect of the deteriorating crystallinity is believed to increase. Although it has been mentioned that the second barrier layer has a function of spacer for separating the well layer from the carrier confinement layer, the function of spacer is considered to deteriorate as the crystallinity of the second barrier layer deteriorates when u=0.1. Also Al mixed crystal ratio of the second barrier layer may have the effect of increasing resistance of the layer, although the effect is considered to be less significant than the carrier confinement layer located at the p-n junction.

As the Comparative Example, changing threshold current is shown by graph(c) in FIG. 9 when the Al mixed crystal ratio of the second barrier layer is 0.15, approximately the same as that of the first barrier layer. As the thickness increases, the threshold current shows a sharp rise which is assumed to be caused by the combined effect of deterioration in crystallinity and the increasing offset, in contrast to the case of u=0.1. As indicated by graph(f) in FIG. 10, the device lifetime becomes further shorter than in the case when u=0.1, presumably by the combined effect of deterioration in crystallinity and the changing band offset.

EXAMPLE 3

A laser device is obtained similarly to Example 1 except for forming the active layer as follows.

(Active Layer 107 (27, 12))

The active layer has a single quantum well structure where the first barrier layer 2a formed from Si-doped $Al_{0.15}Ga_{0.85}N$ to a thickness of 200 Å, the well layer 1b formed from undoped $Al_{0.04}In_{0.02}Ga_{0.94}N$ to a thickness of 100 Å and the second barrier layer 2b formed from undoped $Al_{0.05}Ga_{0.85}N$ to a thickness of 150 Å stacked successively.

The laser device thus obtained, that uses quaternary compound semiconductor AlInGaN for the well layer in contrast to Example 1, oscillates continuously at an approximately the same wavelength, 370 nm, at the room temperature. Although crystallinity may not be good due to the reaction of Al and In during the crystal growth, efficiency of light emission is considered to have been improved by the inclusion of In, resulting in the threshold current of 50 mA that is lower than in the case of Example 1. Device lifetime is similar to that of Example 1.

EXAMPLE 4

A laser device is obtained similarly to Example 1 except for forming the active layer as follows.

(Active Layer 107 (27, 12))

The active layer has a single quantum well structure where the first barrier layer 2a formed from Si-doped $Al_{0.15}In_{0.01}Ga_{0.85}N$ to a thickness of 200 Å, the well layer 1b formed from undoped $Al_{0.04}In_{0.02}Ga_{0.94}N$ to a thickness of 100 Å and the second barrier layer 2b formed from undoped $Al_{0.05}In_{0.01}Ga_{0.85}N$ to a thickness of 150 Å stacked successively.

The laser device thus obtained has a slightly larger threshold current and slightly shorter lifetime than Examples 1 and 3. This is presumably because the quaternary compound semiconductor AlInGaN in all of the barrier layers and the well layers which makes the effect of the deterioration in crystallnity due to the reaction of In and Al more significant than in Example 3. In the meantime, the use of quaternary compound semiconductor AlInGaN tends to decrease the variations in the characteristics among the device chips across the wafer, unlike Examples 1 and 3 where the barrier layers are made of AlGaN, thus improving the production yield. This is supposed that more uniform film formation is achieved by the use of quaternary compound semiconductor AlInGaN than the case of AlGaN.

EXAMPLE 5

A laser device is obtained similarly to Example 1 except for forming the active layer as follows.

(Active Layer 107 (27, 12))

The active layer has a single quantum well structure where the first barrier layer 2a formed from Si-doped $Al_{0.15}Ga_{0.85}N$ to a thickness of 200 Å, the well layer 1b formed from undoped $Al_{0.02}Ga_{0.98}N$ to a thickness of 100 Å and the second barrier layer 2b formed from undoped $Al_{0.05}Ga_{0.95}N$ to a thickness of 150 Å stacked successively.

The laser device thus obtained oscillates at a shorter wavelength, but has a larger threshold current and shorter lifetime than Examples 1 and 3. This is presumably due to the higher Al mixed crystal ratio in the well layer that decreases the band offset with respect to the second barrier layer, resulting in lower efficiency of confining the carrier from the first conductivity type layer into the well layer. This Example appear to have larger variations in the characteristics among the device chips across the wafer than Example 3, presumably because of the variation in film forming over the wafer in contrast to the case where quaternary compound semiconductor AlInGaN is used in the well layer. Thus semiconductor devices can be manufactured with high yield by using a nitride semiconductor including In and Al in either the well layer, the first barrier layer or the second barrier layer. Preferably the nitride semiconductor including In and Al is used in at least the well layer among the layers described above, so that the efficiency of light emission and yield of production can be improved.

EXAMPLE 6

A laser device is obtained similarly to Example 1 except for forming the n-side optical guide layer and the p-side optical guide layer from $Al_xGa_{1-x}N$.

When the Al mixed crystal ratio and the band gap energy are set approximately the same values as the second barrier layer with x=0.15, band offset with respect to the second barrier layer decreases during carrier injection from the second conductivity type layer (second semiconductor layer). However, as shown in FIGS. 3B, 5A and 5B, as the carrier is injected across the p-n junction, effect of the lower offset has smaller influence on the injection efficiency. On the other hand, by increasing the Al mixed crystal ratio of thick layers such as the optical guide layer in the device, this Example shows poor crystallinity and device characteristic, larger threshold current and shorter device lifetime, compared to Example 2 where the barrier layers and the well layers are formed with smaller thickness. This tendency becomes more conspicuous when the Al mixed crystal ratio x of the optical guide layer is increased, particularly when the Al mixed crystal ratio x is made higher than the Al mixed crystal ratio of the first barrier layer, resulting in significantly lower device characteristics. According to the present invention, device characteristics can be improved by decreasing the band gap energy of the first semiconductor layer, second semiconductor layer as shown by Examples 1 to 3 and, particularly in the nitride semiconductor operating at short wavelengths, decreasing the band gap energy and the Al mixed crystal ratio.

EXAMPLE 7

A laser device is obtained similarly to Example 1 except for forming the layers in the active layer as follows.

In case the active layer is formed similarly to Example 1 except for forming the first barrier layer undoped, threshold current becomes as large as 113 mA, indicating that a laser device having low threshold current can be obtained by doping the first barrier layer with an n-type impurity.

When the active layer is formed similarly to Example 1 except for growing Si-doped well layers, a large number of devices per wafer are incapable of laser oscillation indicating that the well is preferably grown undoped when manufacturing laser devices.

A good laser device is obtained although the threshold current becomes higher than in Example 1, by forming the active layer in multiple quantum well structure as shown in FIG. 5A in such a constitution as the first barrier layer 2a formed from Si-doped $Al_{0.15}Ga_{0.85}N$ to a thickness of 100 Å, the well layer 1a formed from undoped GaN to a thickness of 50 Å, the internal barrier layer 2c formed from Si-doped $Al_{0.1}Ga_{0.9}N$ to a thickness of 100 Å, the well layer 1b formed from undoped GaN to a thickness of 50 Å, and the second barrier layer 2b formed from undoped $Al_{0.05}Ga_{0.95}N$ to a thickness of 150 Å stacked successively. This result is considered to be the result of providing the internal barrier layer that decreases the function of the well layer by the internal stress and strong piezoelectric field due to the barrier layer made of AlGaN. This tendency is increased when the Al mixed crystal ratio of the internal barrier layer 2c is made higher than that of the first barrier layer 2a as shown in FIG. 5A, significantly deteriorating the device characteristics combined with the effect of the deteriorating crystallinity due to the nitride semiconductor including Al. When the Al mixed crystal ratio and the band gap energy of the internal barrier layer 2c are made lower than those of the second barrier layer 2b as shown in FIG. 5B, offset between the internal barrier layer and the well layer decreases leading to lower function of distributing to the well layers, together with the effect of the deteriorating crystallinity due to the nitride semiconductor including Al, the band gap energy of the internal barrier layer becomes higher than that of the second barrier layer thus resulting in deteriorating device characteristics.

EXAMPLE 8

A laser device is obtained similarly to Example 1 except for forming the optical guide layer in graded composition as shown in FIG. 8A as follows.

(N-side Optical Guide Layer 106 (First Optical Guide Layer 26))

A film of $Al_xGa_{1-x}N$ is formed to a thickness of 0.15 μm. As the film grows, namely it approaches the active layer, proportion x of Al is changed from 0.1 to 0.02 in order to form an n-side optical guide layer 106 that has graded composition in the direction film thickness. The n-side optical guide layer is doped with Si in a portion thereof where thickness is 0.1 μm (high impurity concentration region) and is grown undoped in the first portion thereof where thickness is 0.05 μm (region of 50 nm on active layer side: low impurity concentration region). In the optical guide layer in the vicinity of the active layer, a small portion that has a band gap energy lower than that of the first barrier layer becomes the first semiconductor layer.

(P-side Optical Guide Layer 109 (Second Optical Guide Layer 29))

A film of $Al_xGa_{1-x}N$ is formed to a thickness of 0.15 μm. As the film grows, proportion x of Al is changed from 0.02 to 0.1 in order to form a p-side optical guide layer 109 that has graded composition in the direction film thickness, wherein the Al mixed crystal ratio and the band gap energy decreases toward the active layer. The p-side optical guide layer is grown undoped in the first portion thereof where thickness is 0.05 μm (region of 0.05 μm on active layer side (low impurity concentration region)) and is doped with Mg in the remaining portion thereof where thickness is 0.1 μm. In the p-side optical guide layer 29 in the vicinity of the active layer and the p-side carrier confinement layer, a small portion that has Al mixed crystal ratio and a band gap energy lower than that of the second barrier layer becomes the second semiconductor layer.

Although the laser device thus obtained has almost the same mean Al composition ratio as Example 1, presence of the optical guide layer having graded band gap energy as shown in FIG. 8A improves the efficiency of injection of carrier into the active layer, and the internal quantum efficiency improves. Since the undoped region (low impurity concentration region) is provided near the active layer in the optical guide layer (active layer side), waveguide structure where optical loss is suppressed by doping with impurity is formed, resulting in decreasing threshold current density.

EXAMPLE 9

A laser device is obtained similarly to Example 1 except for forming the active layer as follows.

(Active Layer 107 (27, 12))

The active layer has a single quantum well structure where the first barrier layer 2a formed from Si-doped $Al_{0.15}Ga_{0.85}N$ to a thickness of 75 Å, the well layer 1b formed from undoped $In_{0.02}Ga_{0.98}N$ to a thickness of 100 Å and the second barrier layer 2b formed from undoped $Al_{0.1}Ga_{0.9}N$ to a thickness of 45 Å stacked successively.

The laser device thus obtained, that oscillates continuously at room temperature at a wavelength of 371 nm and a threshold current of 30 mA.

EXAMPLE 10

A laser device is obtained similarly to Example 1 except for forming the active layer as follows.

(Active Layer 107 (27, 12))

The active layer has a multiple quantum well structure where the first barrier layer 2a formed from Si-doped $Al_{0.15}Ga_{0.85}N$ to a thickness of 75 Å, the well layer 1a formed from undoped $In_{0.02}Ga_{0.98}N$ to a thickness of 50 Å, the internal barrier layer 2c formed from Si-doped $Al_{0.1}Ga_{0.9}N$ to a thickness of 50 Å, the well layer 1b formed from undoped $In_{0.02}Ga_{0.98}N$ to a thickness of 50 Å and the second barrier layer 2b formed from undoped $Al_{0.1}Ga_{0.9}N$ to a thickness of 50 Å stacked successively.

The laser device thus obtained, that oscillates continuously at room temperature at a wavelength of 371 nm and a threshold current of 30 mA.

EXAMPLE 11

Figures 6A, 6B, 6C:
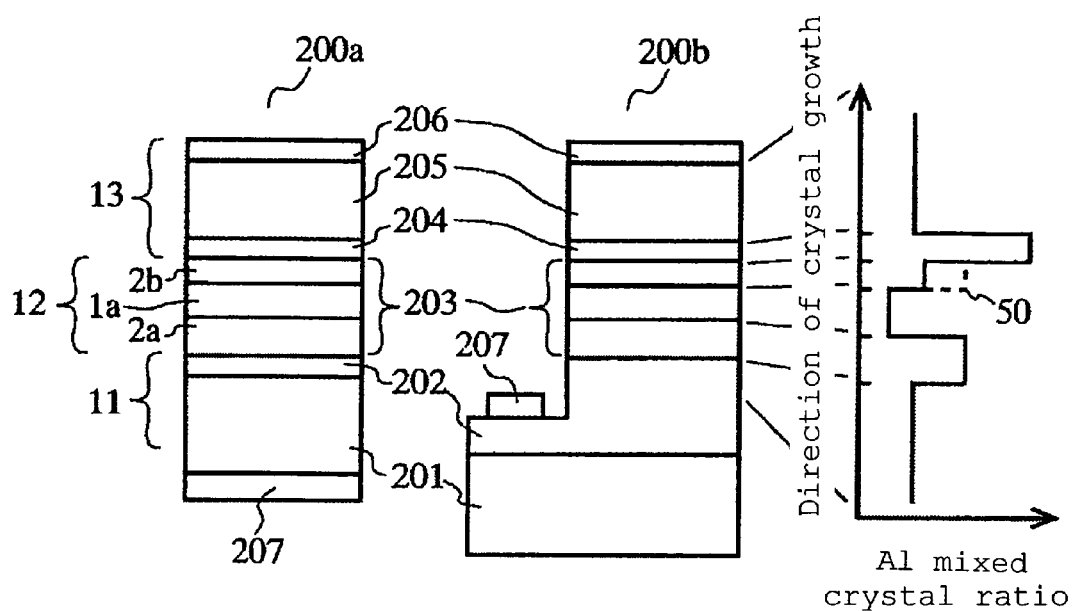
FIGS. 6A and 6B are schematic sectional views showing the stacking structure according to one embodiment of the present invention and FIG. 6C is a diagram showing the proportions of Al in the layers.

A light emitting device 200b of the present invention will be described below with reference to FIG. 6B. The light emitting device is made in such a structure where a pair of positive and negative electrodes are formed on the same side of the substrate as indicated by 200b.

A substrate 201 made of sapphire (C plane) is set in an MOVPE reaction vessel, with the substrate temperature raised to 1,050° C. while flowing hydrogen, and the substrate is cleaned.

Buffer layer (not shown): With the temperature lowered to 510° C., a buffer layer made of GaN is formed to a thickness of about 100 Å by low-temperature growing on the substrate 1. This layer grown at a low temperature is grown at a temperature lower than the layer to be grown next, so as to mitigate the lattice mismatch with the substrate, and may be omitted depending on the type of the substrate.

Base layer (not shown): After growing the buffer layer, the base layer made of undoped GaN is formed to a thickness of 1.5 μm at temperature of 1,050° C. The base layer serves as the substrate whereon to grow the device structure.

N-side contact layer 202: Then an n-side contact layer 202 (current injection layer) made of $Al_{0.05}Ga_{0.95}N$ doped with Si in concentration of $4.5 \times 10^{18}/cm^3$ is formed to a thickness of 2 μm at a temperature of 1,050° C. The n-side contact layer 202 becomes the first semiconductor layer.

Active layer 203: A barrier layer (the first barrier layer 2a) is formed from undoped $Al_{0.15}Ga_{0.85}N$ to a thickness of 100 Å, and a well layer is formed from undoped $Al_{0.05}Ga_{0.95}N$ to a thickness of 30 Å. Then an internal barrier layer (not shown) is formed from $Al_{0.1}Ga_{0.9}N$ to a thickness of 30 Å, and four well layers 1 (not shown) and three internal well layers (not shown) are stacked alternately, with $Al_{0.1}Ga_{0.9}N$ being formed to a thickness of 40 Å as the second barrier layer 2b, thereby forming the active layer 203 in multiple quantum well structure with total thickness of 380 Å. The active layer has such a structure as the internal barrier layer (2b, etc.) having lower Al mixed crystal ratio and lower band gap energy than the first barrier layer 2a and higher Al mixed crystal ratio and higher band gap energy than the second barrier layer 2b is formed as shown in FIG. 5B.

P-side cladding layer 204: Layer A 204 made of undoped $Al_{0.2}Ga_{0.9}N$ is formed to a thickness of 40 Å and layer B 205 made of $Al_{0.05}Ga_{0.95}N$ doped with Mg in concentration of $5 \times 10^{19}/cm^3$ is formed to a thickness of 25 Å. These operations are repeated so as to stack the layer A and then layer B thereon five times, capped by layer A to a thickness of 40

Å, so as to form the p-side multiple layer cladding layer 204 of super lattice structure having total thickness of 365 Å. The first layer B becomes the second semiconductor layer having the band gap energy and the Al mixed crystal ratio that are lower than those of the second barrier layer.

P-side contact layer 205: Then the p-side contact layer 205 made of GaN doped with Mg in concentration of $1\times10^{20}/cm^3$ is formed to a thickness of 200 Å.

Upon completion of the reaction, the temperature is lowered to the room temperature, and the wafer is annealed at 700° C. in nitrogen atmosphere within the reaction vessel, thereby to decrease the resistance of the p-type layer.

After annealing, the wafer is taken out of the reaction vessel. A mask of a predetermined shape is formed on the surface of the p-side contact layer 205 provided on the top, and the p-side contact layer 205 is etched in an RIE (reactive ion etching) apparatus, thereby exposing the n-side contact layer 202 as shown in FIG. 6B.

After etching, a p-side electrode 206 made of a material including Ni and Au which can transmit light is formed to a thickness of 200 Å over substantially the entire surface of the p-side contact layer 205 provided on the top, and a p-side pad electrode (not shown) made of Au for bonding is formed to a thickness of 0.5 μm on the p-side electrode 206. On the other hand, an n-side electrode 207 which includes W and Al is formed on the surface of the n-side contact layer 202 which has been exposed by etching, thereby to obtain an LED.

The LED device emits ultraviolet light of wavelength 360 nm, and providing the second barrier layer enables it to form the active layer with good crystallinity so as to obtain light emitting device having excellent light emission characteristic.

Comparative Example 1

As show in Example 2, with the Al mixed crystal ratio u of the second barrier layer being set to 0.15 same as the first barrier layer in Example 1, changes in the threshold current and the device lifetime with changing thickness were measured as indicated by graph (c) in FIG. 9 and graph (f) in FIG. 10, respectively.

INDUSTRIAL APPLICABILITY

As mentioned above, the nitride semiconductor device of the present invention makes it possible to obtain light emission device and laser device operating at a short wavelength of 375 nm or less with a low threshold current. Thus a substitute for fluorescent lamp can be provided by combining the light emitting diode with a fluorescent substance that is excited in ultraviolet region.

The laser device shows excellent FWHM so as to obtain excellent resolution, and is therefore useful as the light source for photolithography and optical art.

The present invention may be implemented in various other embodiments without deviating from the spirit, concept and scope of the invention. Therefore it should be noted that the embodiments described herein are mere examples in all aspects and do not restrict the scope of the invention that is defined in the claims. Also it should be noted that any variations and modification of the invention that fall in the scope of the claims are included in the scope of the invention.

The invention claimed is:

1. A semiconductor device, comprising:

an active layer having a quantum well structure including a plurality of well layers, a first barrier layer, a second barrier layer, and an internal barrier layer provided between the first barrier layer and the second barrier layer via at least one well layer, wherein the active layer includes at least one well layer formed of nitride semiconductor and at least one barrier layer formed of nitride semiconductor;

a first conductivity type layer and a second conductivity type layer, wherein the active layer is sandwiched between the first conductivity type layer and the second conductivity type layer, the first conductivity type layer comprises an n-type nitride semiconductor, the second conductivity type layer comprises a p-type nitride semiconductor, the first barrier layer is provided on the side of the first conductivity type layer in the active layer, and the second barrier layer is provided on the side of the second conductivity type layer in the active layer, and wherein the second conductivity type layer is separated from the active layer via a carrier confinement layer, the carrier confinement layer has a band gap energy higher than that of the first barrier layer, the second barrier layer has a band gap energy lower than that of the first barrier layer, the internal barrier layer has a band gap energy different from that of the second barrier layer, the second conductivity type layer includes a second semiconductor layer having a band gap energy lower than that of the first barrier layer, the first barrier layer has a band gap energy higher than that of the internal barrier layer.

2. The semiconductor device of claim 1, wherein the internal barrier layer has a band gap energy higher than that of the second barrier layer.

3. A semiconductor device, comprising:

an active layer having a quantum well structure including a plurality of well layers, a first barrier layer, a second barrier layer, and an internal barrier layer provided between the first barrier layer and the second barrier layer via at least one well layer, wherein the active layer includes at least one well layer formed of nitride semiconductor and at least one barrier layer formed of nitride semiconductor;

a first conductivity type layer and a second conductivity type layer, wherein the active layer is sandwiched between the first conductivity type layer and the second conductivity type layer, the first conductivity type layer comprises an n-type nitride semiconductor, the second conductivity type layer comprises a p-type nitride semiconductor, the first barrier layer is provided on the side of the first conductivity type layer in the active layer, and the second barrier layer is provided on the side of the second conductivity type layer in the active layer, and wherein the second conductivity type layer is separated from the active layer via a carrier confinement layer, the carrier confinement layer has a band gap energy higher than that of the first barrier layer, the second barrier layer has a band gap energy lower than that of the first barrier layer, the internal barrier layer has a band gap energy different from that of the second barrier layer, the second conductivity type layer includes a second semiconductor layer having a band gap energy lower than that of the first barrier layer, the first conductivity type layer includes a first semiconductor layer having a band gap energy lower than that of the first barrier layer, and the internal barrier layer has a band gap energy lower than that of the first conductivity type layer.

* * * * *